(12) United States Patent
Itoh

(10) Patent No.: US 8,884,647 B2
(45) Date of Patent: Nov. 11, 2014

(54) INTEGRATED CIRCUIT AND METHOD OF USING THE SAME

(75) Inventor: Tomoyasu Itoh, Nagoya (JP)

(73) Assignee: Denso Corporation, Kariya (JP)

( * ) Notice: Subject to any disclaimer, the term of this patent is extended or adjusted under 35 U.S.C. 154(b) by 217 days.

(21) Appl. No.: 13/577,949

(22) PCT Filed: Feb. 16, 2011

(86) PCT No.: PCT/JP2011/053225
§ 371 (c)(1),
(2), (4) Date: Aug. 9, 2012

(87) PCT Pub. No.: WO2011/102362
PCT Pub. Date: Aug. 25, 2011

(65) Prior Publication Data
US 2012/0306532 A1  Dec. 6, 2012

(30) Foreign Application Priority Data

Feb. 16, 2010 (JP) ................................ 2010-049803

(51) Int. Cl.
*H03K 19/173* (2006.01)
*H03K 19/177* (2006.01)

(52) U.S. Cl.
CPC ...... *H03K 19/1733* (2013.01); *H03K 19/17704* (2013.01)
USPC .................................. 326/38; 326/41; 326/47

(58) Field of Classification Search
USPC ................................................ 326/37–41, 47
See application file for complete search history.

(56) References Cited

U.S. PATENT DOCUMENTS

| | | | |
|---|---|---|---|
| 5,218,240 A * | 6/1993 | Camarota et al. | ............... 326/39 |
| 6,339,341 B1 | 1/2002 | Fujii et al. | |
| 6,424,171 B1 | 7/2002 | Motomura et al. | |

FOREIGN PATENT DOCUMENTS

| | | |
|---|---|---|
| JP | A-01-194608 | 8/1989 |
| JP | A-05-074935 | 3/1993 |
| JP | A-09-074351 | 3/1997 |
| JP | A-2005-057451 | 3/2005 |

OTHER PUBLICATIONS

Office Action mailed Sep. 10, 2013 in the corresponding JP application No. 2012-500614 (English translation).
International Search Report mailed on Mar. 15, 2011 for the corresponding International patent application No. PCT/JP2011/053225 (and English translation).
Written Opinion mailed on Mar. 15, 2011 for the corresponding International patent application No. PCT/JP2011/053225 (and English translation).

* cited by examiner

*Primary Examiner* — Jany Richardson
(74) *Attorney, Agent, or Firm* — Posz Law Group, PLC

(57) ABSTRACT

An integrated circuit wherein all elements such as a chip area, a cost, a function to change a logic, an operating frequency, flexibility, a throughput and electric power consumption can be improved; and a reconfigurable processor wherein a function of an instruction can be changed, are provided. A high-density logic reconfigurable leaf cell is defined. The integrated circuit is characterized in that: a logic reconfigurable leaf cell module, which is integrated with high density by arranging a plurality of leaf cells regularly to minimize the connection channel area for a signal between the leaf cells, and the reconfigurable processor, which can change the function of an instruction set by inserting the logic reconfigurable leaf cell module into a data path of an instruction execution process circuit, are integrated.

21 Claims, 27 Drawing Sheets

$$f(X_1, X_2) = S_0\overline{X_1}\overline{X_2} + S_1\overline{X_1}X_2 + S_2X_1\overline{X_2} + S_3X_1X_2$$

Input x₁    Input x₂

$f_1(x_1,x_2)$

Output $f_1(x_1,x_2)=x_2$

Input x₁          Input x₂

$$f_1(X_1, X_2) = S_{00}\overline{X_1}\overline{X_2} + S_{01}\overline{X_1}X_2 + S_{02}X_1\overline{X_2} + S_{03}X_1X_2$$

$$f_2(X_1, X_2) = S_{10}\overline{X_1}\overline{X_2} + S_{11}\overline{X_1}X_2 + S_{12}X_1\overline{X_2} + S_{13}X_1X_2$$

Output $f_1(x_1,x_2)$      Output $f_2(x_1,x_2)$

FIG. 18

| c0 | c1 | c2 | c3 | Logic |
|---|---|---|---|---|
| 0 | 0 | 0 | 0 | 0 |
| 1 | 0 | 0 | 0 | a and b |
| 0 | 1 | 0 | 0 | (not a) and b |
| 1 | 1 | 0 | 0 | b |
| 0 | 0 | 1 | 0 | a and (not b) |
| 1 | 0 | 1 | 0 | a |
| 0 | 1 | 1 | 0 | a xor b |
| 1 | 1 | 1 | 0 | a or b |
| 0 | 0 | 0 | 1 | a nor b |
| 1 | 0 | 0 | 1 | a xnor b |
| 0 | 1 | 0 | 1 | not a |
| 1 | 1 | 0 | 1 | (not a) or b |
| 0 | 0 | 1 | 1 | not b |
| 1 | 0 | 1 | 1 | a or (not b) |
| 0 | 1 | 1 | 1 | a nand b |
| 1 | 1 | 1 | 1 | 1 |

INTEGRATED CIRCUIT AND METHOD OF USING THE SAME

TECHNICAL FIELD

The present invention generally relates to an integrated circuit and a method of using the same. Specifically, the present invention relates to the integrated circuit capable of reconfiguring logic, a reconfigurable processor having an instruction set capable of changing a function, and a compile processing method.

BACKGROUND ART

Conventionally, in a semiconductor integrated circuit, high performance and a small chip area are realized by designing a dedicated LSI, and a low manufacturing cost is realized by mass production. However, it is necessary to develop the integrated circuit individually according to each application. The cost for development is increasing. Further, it is not easy to change the function in the dedicated LSI. In general, when it is required for the LSI to change the function, a part of or a whole of the design and the manufacturing process have to be reconstructed.

When the function in a FPGA (field programmable gate array) is changed, it is not necessary to re-execute the manufacturing process, but it is necessary to re-execute the designing process after the RTL design. Specifically, in the timing design, the length of an wiring channel for connecting between logic elements is not clear until the logic elements are laid out. In general, since a roundabout amount of the wiring channel path is large, an operating frequency of the FPGA is low, compared with the dedicated LSI and ASIC. Thus, a difficulty arises such that the maximum operating frequency of the FPGA may be varied at every time when the FPGA is re-designed. Further, since a large channel region is necessary to couple between logic elements, a chip area of the FPGA is a few times or ten times larger than the dedicated LSI, and therefore, it is difficult to reduce a cost of the FPGA.

The function change in the processor or a DSP is flexibly possible in a process executed by a soft ware, and general versatility is high, so that mass production is possible, and a cost is low in general. However, the processor and the DSP have poor performance for executing a calculation per one bit unit, compared with logical operation per one register unit and product-sum operation. Further, it is difficult to obtain sufficient performance for executing a complicated communication processing and an advanced image processing, compared with the dedicated LSI. In order to increase the performance, an approach to increase an operating frequency is generally used. However, a difficulty arises such that this approach provides to increase electric power consumption.

It is possible for a DRP (dynamic reconfigurable processor) to manage a function change, so that the DRP is favorable to execute high speed processing, compared with a soft ware processing with using a conventional processor. However, the number of elements for providing a logical reconfiguration unit in pervious products of the DRP is 16 to 1024, and therefore, the number of elements is smaller than the FPGA. Thus, the DRP has a difficulty with flexibility. Further, a comparatively large wiring channel region for coupling between logical reconfiguration elements is necessary. In some cases, a roundabout amount of the wiring for coupling via the wiring channel may be large. Thus, a transmission delay of a signal as a critical path is large, so that a difficulty arises such that it is difficulty to increase the operating frequency, compared with the dedicated LSI. Further, a wiring channel region for coupling between a configuration memory for the logical reconfiguration element and the logical reconfiguration element is necessary. Thus, in general, the area is larger than the dedicated LSI and the ASIC. Thus, a difficulty arises such that it is difficult to reduce the cost.

PRIOR ART LITERATURES

Patent Literatures

[Patent Literature 1] JP-A-2000-232162
[Patent Literature 2] JP-A-2000-138579
[Patent Literature 3] JP-A-H09-74351
[Patent Literature 4] JP-A-H05-74935

DISCLOSURE OF INVENTION

Object to be Solved by Invention

In the conventional integrated circuit, the following difficulties arise in some cases.

(1) A dedicated LSI, which requires redesign and semiconductor manufacturing process change according to requirements of a function change although a high throughput is achieved.

(2) FPGA, which has a difficulty about the operating frequency and the cost although it is not necessary to change the semiconductor manufacturing process in each application.

(3) A processor and a DSP, which have difficulty about an operation efficiency per one bit unit, a throughput and an electric power consumption although the processor and the DSP have general versatility, and are capable of managing the function change flexibly.

(4) DRP, which has a difficulty about the flexibility and the operating frequency although the DRP is capable of managing the function chamber flexibly.

The above devices have merits and demerits regarding the logical changeability of the logic element, the number of elements in the logic reconfiguration unit, the operating frequency, the chip area, the general versatility, the electric power consumption and the cost, respectively. Thus, the type of product of the integrated circuit has to be selected appropriately according to the application, the development cost and the business environment. The present invention is provided in order to solve the above difficulties.

Means for Solving Object

The present invention has a main construction unit including a plurality of logic reconfiguration elements, a plurality of memory elements of logic configuration for defining logics of the logic reconfiguration elements, respectively, a data signal channel, a memory element control signal channel, and a signal terminal. The transmission delay of a signal, the electric power consumption and the chip area of this unit are optimized according to a manual designing method or a designing method with using a CAD tool. Thus, a high-density leaf cell, which has capability of logic reconfiguration, is defined. A plurality of leaf cells are arranged in a predetermined regularity so that a connection channel area of a signal between leaf cells is minimized. The integrated circuit module, which is integrated with high density, and the reconfigurable processor, which is capable of changing a function of an instruction set by inserting the integrated circuit module into a data bus of an instruction execution processing circuit, are coupled with the system bus and the local bus via the bus interface circuit, respectively. Then, the information in the memory element for the logic configuration is rewritten, so that the integrated circuit capable of changing the function without redesign of circuit is provided.

Effect of Invention

The present invention provides to develop an integrated circuit capable of integrating one of or both of an integrated circuit and a reconfigurable processor. The integrated circuit is characterized in that the integrated circuit can change a function without redesign of circuit, has high flexibility, a reliable high operating frequency, and low electric power consumption, and provides high-density. The reconfigurable processor is characterized in that a throughput of the process is capable of increasing compared with a conventional processor.

BRIEF DESCRIPTION OF DRAWINGS

FIG. 1 shows an example of a circuit of a leaf cell according to the present invention.
FIG. 2 shows an example of a circuit of a leaf cell module, in which multiple leaf cells are arranged in a predetermined regularity, according to the present invention.
FIG. 3 shows an example of a circuit of multiple leaf cells and multiple feedback circuits, which are arranged in a predetermined regularity, according to the present invention.
FIG. 4 shows an example of a complex leaf cell module via an interface circuit according to the present invention.
FIG. 5 shows an example of an integrated circuit coupled with a leaf cell module connecting to a bus according to the present invention.
FIG. 6 shows an example of architecture of a reconfigurable processor according to the present invention.
FIG. 7 shows an example of an integrated circuit with a reconfigurable processor and a leaf cell module, which are connected to a bus, according to the present invention.
FIG. 8 shows a compile process of a reconfigurable processor according to the present invention.
FIG. 9 shows an illustrative embodiment of an integrated circuit according to the present invention.
FIG. 10 shows a logical equation for explaining principle of the present invention.
FIG. 11 shows a logical block for providing a logical equation according to the present invention.
FIG. 12 shows a unit cell for providing a logical equation according to the present invention.
FIG. 13 is a diagram explaining an operation of the unit cell.
FIG. 14 is a diagram explaining an operation of the unit cell.
FIG. 15 is a diagram explaining an operation of the unit cell.
FIG. 16 is a diagram explaining an array and its function according to the present invention.
FIG. 17 is a circuit diagram showing a gate level of a logical block according to an embodiment of the present invention.
[FIG. 18]
FIG. 18 shows a truth value diagram of a logical block according to an embodiment of the present invention.
FIG. 19 is a circuit diagram showing a gate level of a unit cell according to an embodiment of the present invention.
FIG. 20 is a circuit diagram showing a transistor level of a unit cell according to an embodiment of the present invention.
FIG. 21 is a circuit diagram showing a transistor level of an array according to an embodiment of the present invention.
FIG. 22 is a circuit diagram showing a transistor level of an array according to an embodiment of the present invention.
FIG. 23 is a circuit diagram showing a gate level of a unit cell according to a modification of the present invention.
FIG. 24 is a circuit diagram showing a transistor level of a unit cell according to a modification of the present invention.
FIG. 25 is a circuit diagram showing a transistor level of an array according to a modification of the present invention.
FIG. 26 is a circuit diagram showing a transistor level of an array according to a modification of the present invention.
FIG. 27 is a circuit diagram showing a transistor level of an array according to a modification of the present invention.
FIG. 28 is an arrangement diagram showing an array and a sub-array according to an embodiment of the present invention.
FIG. 29 shows an example of use according to an embodiment of the present invention.
FIG. 30 shows an example of use according to an embodiment of the present invention.
FIG. 31 shows an example of use according to an embodiment of the present invention.

EMBODIMENTS FOR CARRYING OUT INVENTION 1-1. Summary of Invention

The summary of the present invention will be explained as follows.

Figure 1:
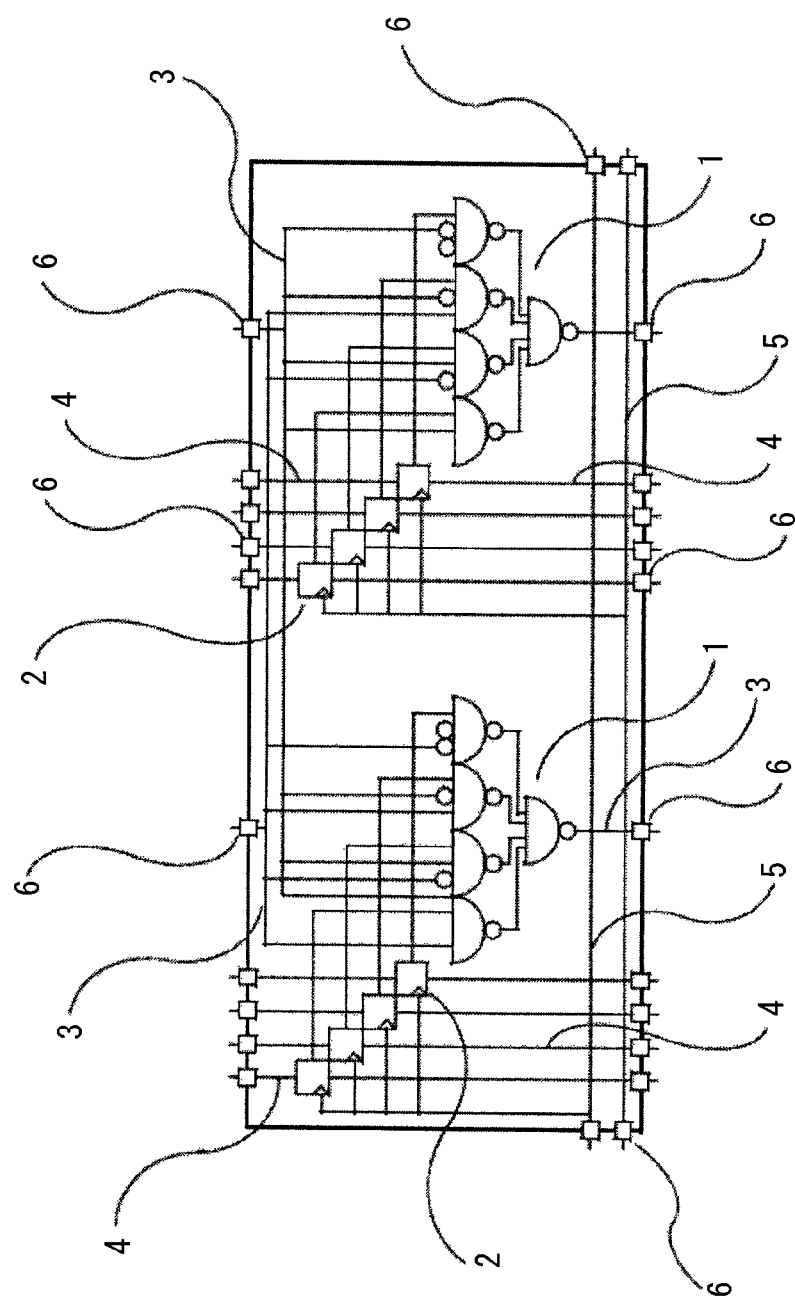
[FIG. 1]
Figure 2:
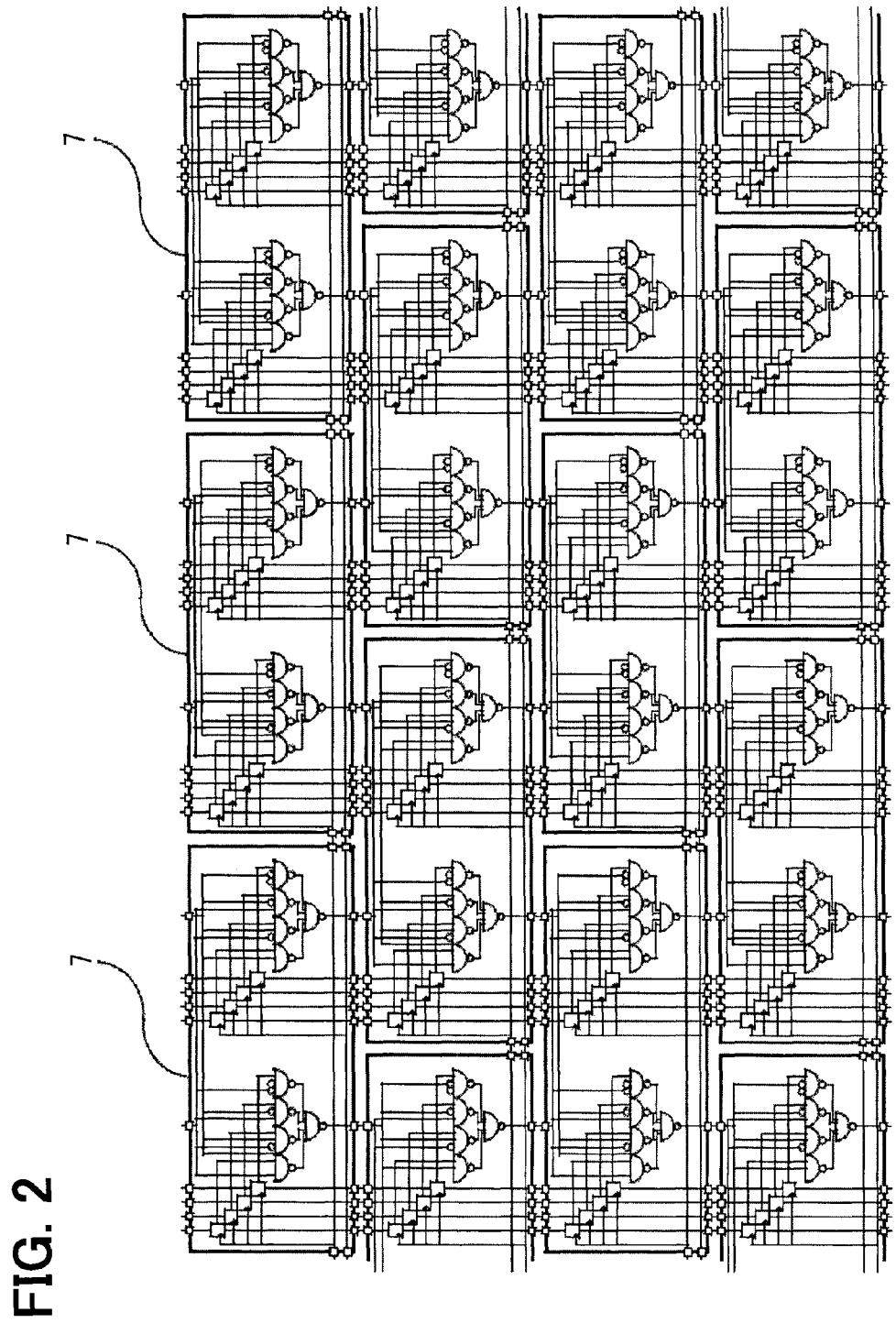
[FIG. 2]

As shown in FIG. 1, a structural unit cell of an integrated circuit defined as a leaf cell according to the present invention includes multiple logic reconfiguration elements 1, multiple memory elements 2 for logic configuration, a logic data signal channel 3, a data channel 4 for logic configuration, a control signal channel 5 for the memory element of the logic configuration, and an input/output signal terminal 6. Each logic reconfiguration element 1 is provided by a circuit such as a product-sum logic circuit, a sum-product logic circuit and a ring-sum logic circuit. Each memory element 2 for logic configuration is provided by a memory element such as a latch element, a flip-flop element, a SRAM, a DRAM, and a flash memory for defining a logic of the logic reconfiguration element. The structural unit cell is integrated with high density according to a manual designing method or a designing method with using a CAD tool. Thus, the transmission delay of a logic data signal, the electric power consumption and the chip area are optimized. When all of logic data input signals are input into all of the logic reconfiguration elements, respectively, a change and a division of a signal path between the input terminal and the output terminal of the leaf cell are executed. When the information in the memory element for the logic configuration is rewritten, the change of the logic of the logic reconfiguration element is executed.

Multiple leaf cells 7, which are manually designed and is logically reconfigurable, are arranged in a predetermined regularity such as a brick lay. A transmission delay time between logic data signal terminals of the logical reconfigurable leaf cells, which are adjacent to each other in an up-down direction, is minimized, and a distance between the data signal terminals of the memory elements for logic configuration is also minimized. When the information in the memory elements of logic configuration in the leaf cells, which are arranged in a predetermined regularity such as a brick lay, is rewritten, the change of logic and the change and the division of the signal path are executable.

Figure 3:
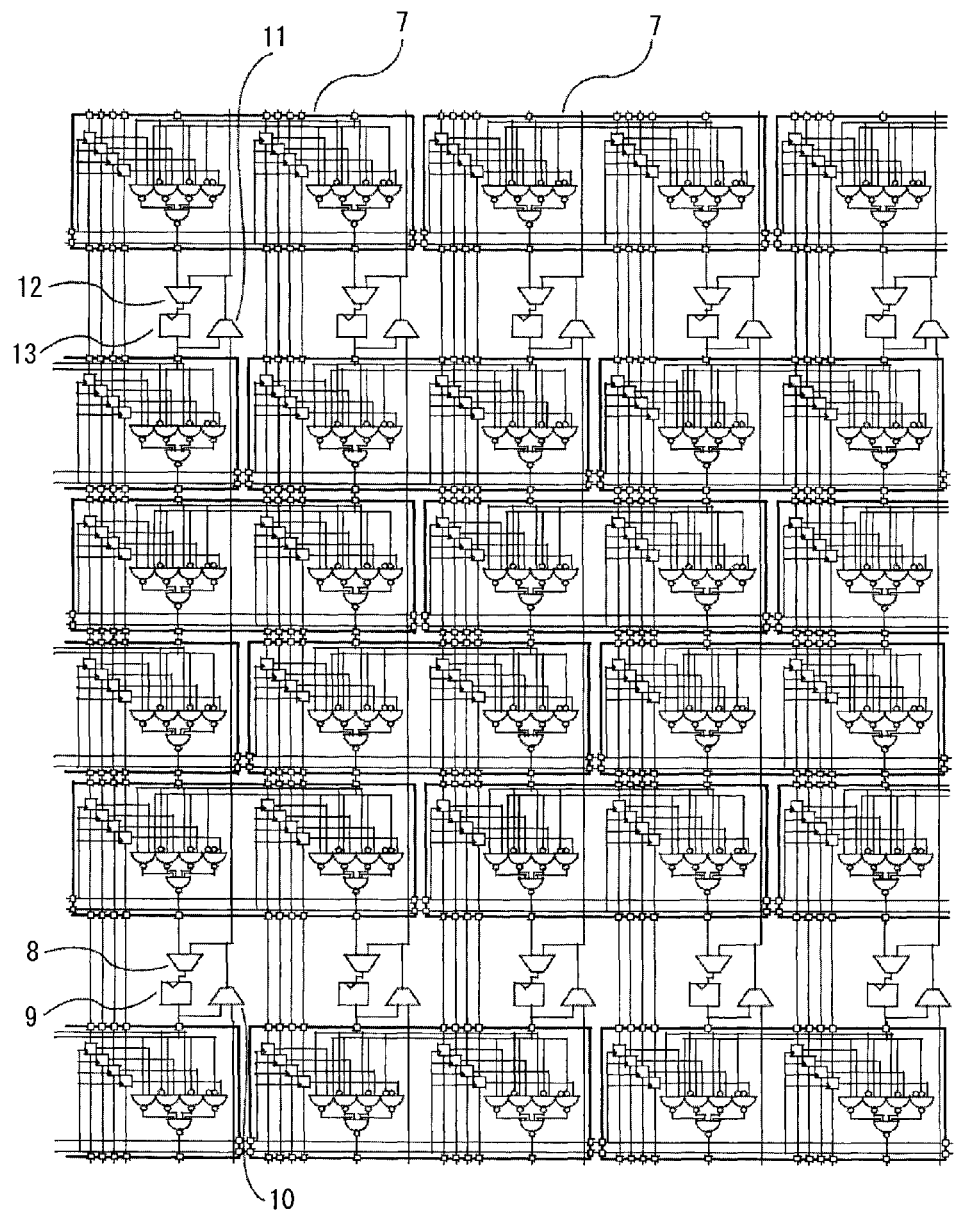
[FIG. 3]

In FIG. 3, the signal selector and the memory element such as the flip-flop circuit and the latch circuit are arranged in each logic data signal on a upstream side and a downstream side of the logic reconfigurable leaf cell module, which are provided by multiple logic reconfigurable leaf cells 7 arranged in the predetermined regularity. The logic data output signal of the leaf cell module is input into a logic data input terminal of the memory element 9 such as the flip-flop circuit and the latch circuit via the logic data signal selector 8. The logic data output signal of the memory element such as the flip-flop circuit and the latch circuit is fed back to a previous feedback signal selector 11 via a feedback signal selector 10. Further, the logic data output signal is fed back to the logic data input terminal of the previous memory element 13 such as the flip-flop circuit and the latch circuit via the previous logic data signal selector 12. As a result, the memory of the logic data signal and the feedback of the logic data signal are executed in a scalable manner in each leaf cell module. The memory capacity for storing the logic data signal can be set at any value according to a construction ratio between the logic reconfigurable leaf cells arranged in the predetermined regularity and the memory elements such as the flip-flop circuit and the latch circuit.

The integrated circuit according to the present invention can reconfigure the signal path and the logic at the same time by rewriting the information of the memory element for logic configuration. This means that a test circuit can be reconfigured without a dedicated test circuit, and a self test of a circuit can be executed by reconfiguring a self diagnosis circuit. When a failure is detected based on a result of the circuit test, a signal path for bypassing a failure circuit is reconfigured by rewriting the information of the memory element for logic configuration. Thus, even if the failure portion exists, the circuit functions normally.

Figure 4:
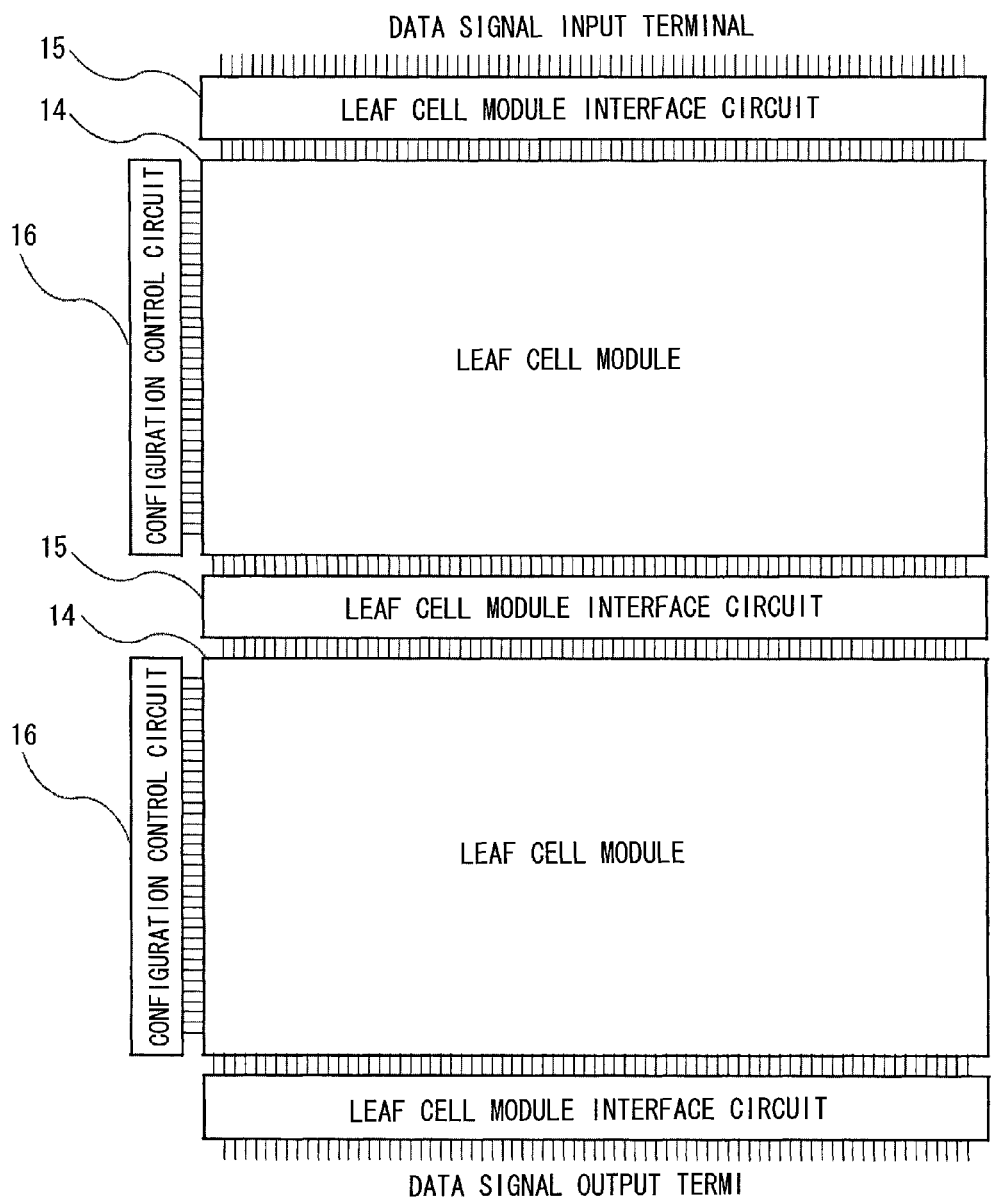
[FIG. 4]

Multiple logic reconfigurable leaf cell modules 14, each of which is provided by multiple logic reconfigurable leaf cells arranged in the regularity, are successively coupled with each other via the leaf cell module interface circuit 15 so that a function is expanded. This system will be shown as an example. FIG. 4 is an example of a complex module in a case where two logic reconfigurable leaf cell modules 14 are coupled with each other. Each logic reconfigurable leaf cell module 14 is coupled with the logic configuration control circuit 16. The control circuit 165 controls the configuration memory element in the leaf cell to write, to store and to delete the information about logic configuration. Further, since the configuration memory elements are structurally and separately arranged in the leaf cell module, the signal channel region between the logic configuration control circuit and the leaf cell module can be smaller than a conventional FPGA and DRP.

Figure 5:
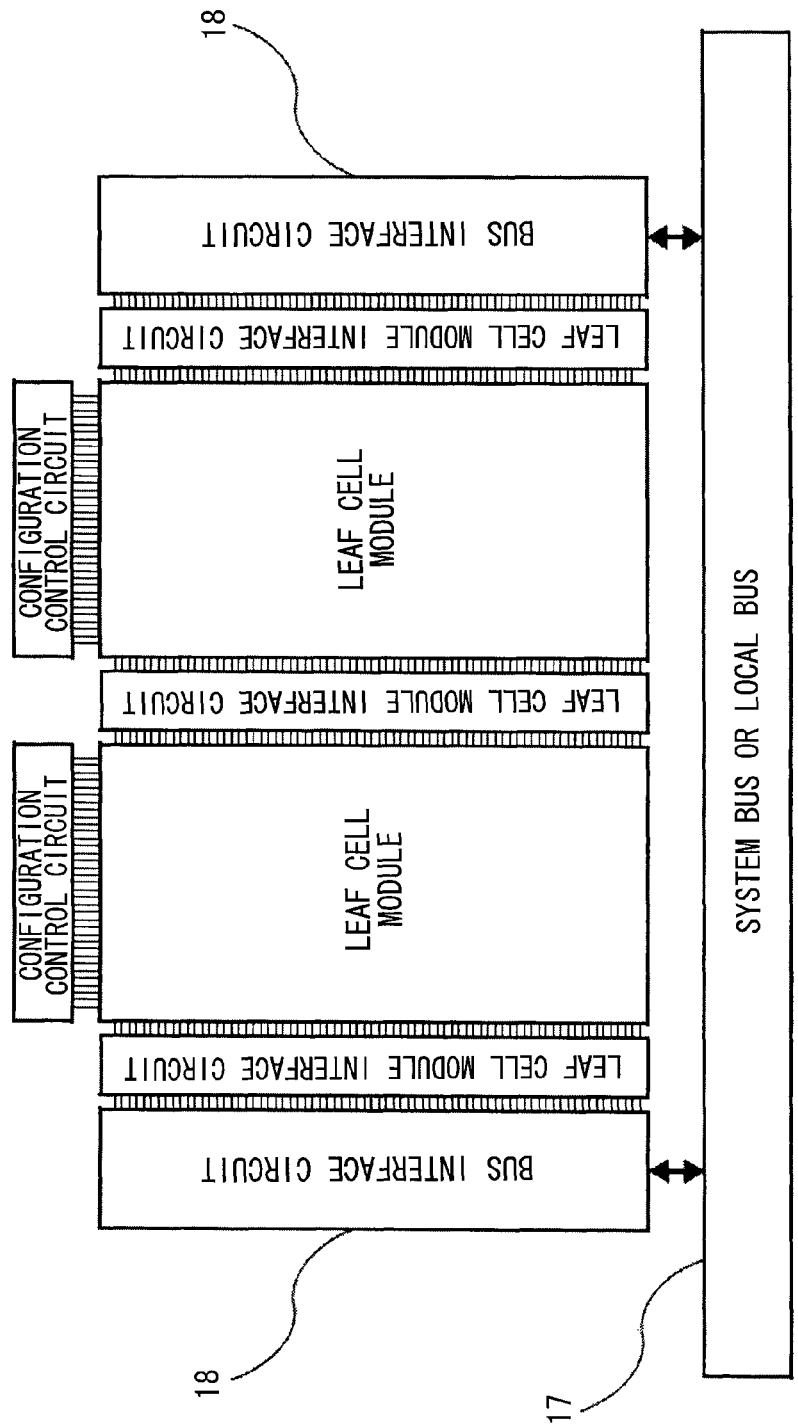
[FIG. 5]

One or multiple logic reconfigurable leaf cell modules can be connected to the system bus or the local bus via the bus interface circuit 18 and the leaf cell module interface circuit. FIG. 5 shows an example of a circuit construction, in which two logic reconfigurable leaf cell modules provide a complex module, and the complex module is connected to the bus.

Figure 6:
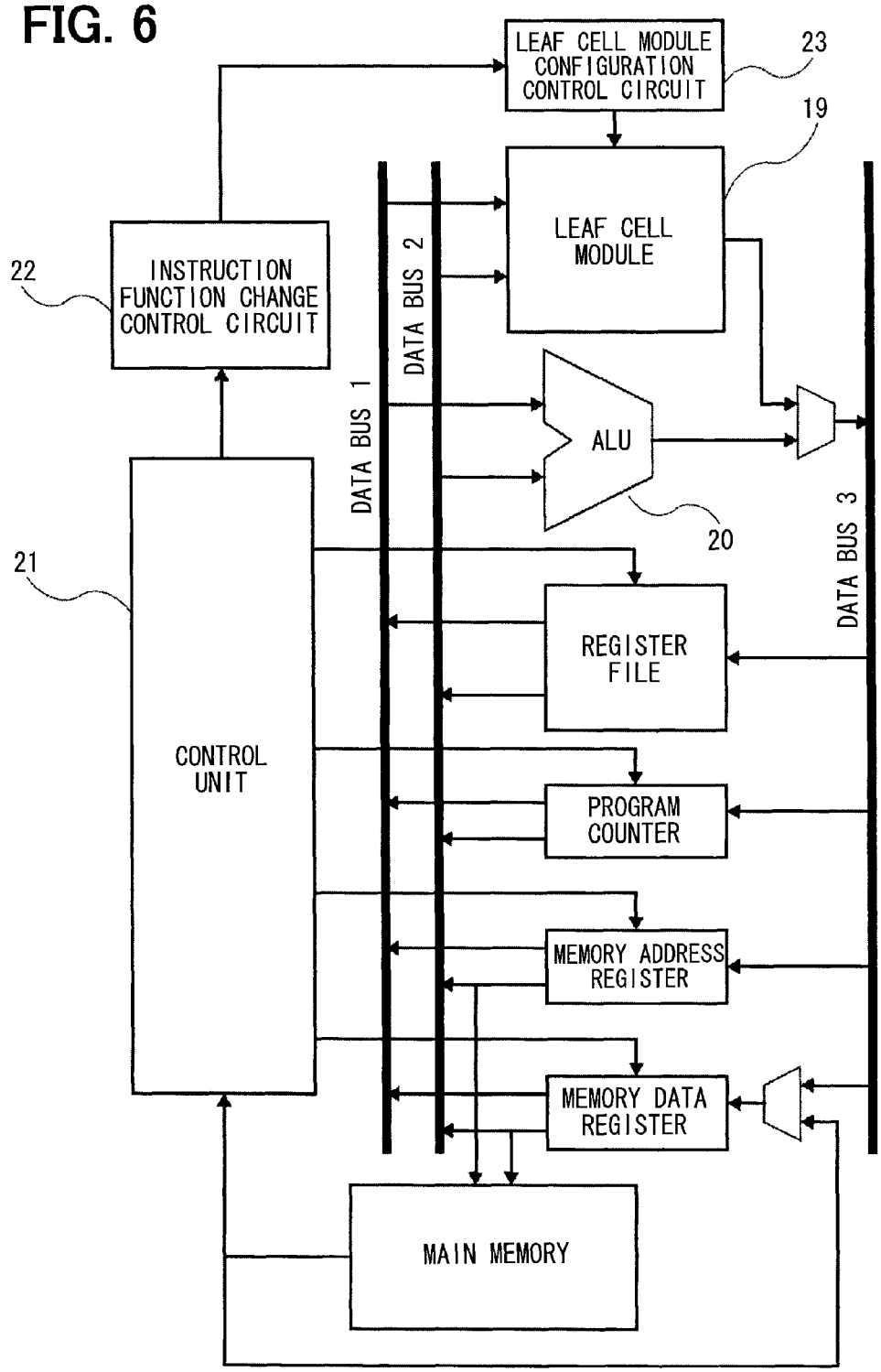
[FIG. 6]

The logic reconfigurable leaf cell modules arranged in the predetermined regularity can be used for a processor. FIG. 6 shows an example of architecture of a reconfigurable processor, which can change a function of an instruction set by inserting the logic reconfigurable leaf cell module 19 into the data bus of the instruction execution processing circuit of the processor so that the information of the memory element for logic configuration arranged in each leaf cell is rewritten. This is a processor architecture having both of the instruction executed by the ALU 20 and the instruction set, a function of which is changeable with using the leaf cell module. In this example of the architecture, according to the instruction decoded by the control unit 21, the instruction function change control circuit 22 generates the function change information and the timing information about the function change when it is the function changeable instruction. According to the information, the leaf cell module configuration control circuit 23 reconfigures the logic function of the leaf cell module. Further, a normal instruction, which does not provide function change, is executed by the ALU 20 as usual.

Figure 7:
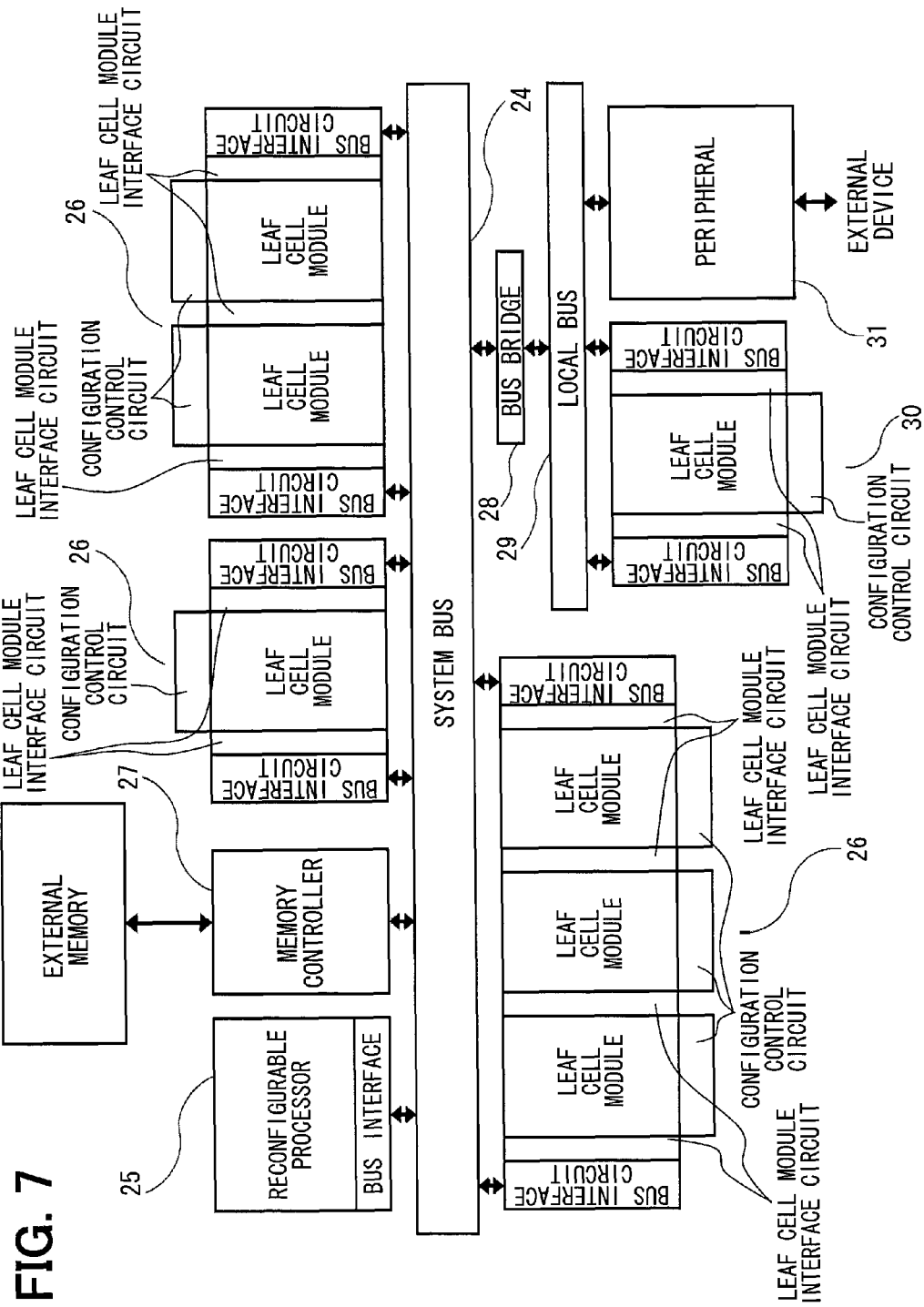
[FIG. 7]

Each of one or multiple logic reconfigurable leaf cell modules arranged in the predetermined regularity and one or multiple configurable processors having the function changeable instruction set is connected to the system bus and the local bus via the bus interface circuit, respectively. FIG. 7 shows an example of a system construction, in which the system bus 24 is connected to the reconfigurable processor 25 having the function changeable instruction set, three complex leaf cell modules 26 and the memory controller 27, and further, the local bus 29 is connected to the logic reconfigurable leaf cell module 30 and the peripheral circuit 31.

Figure 8:
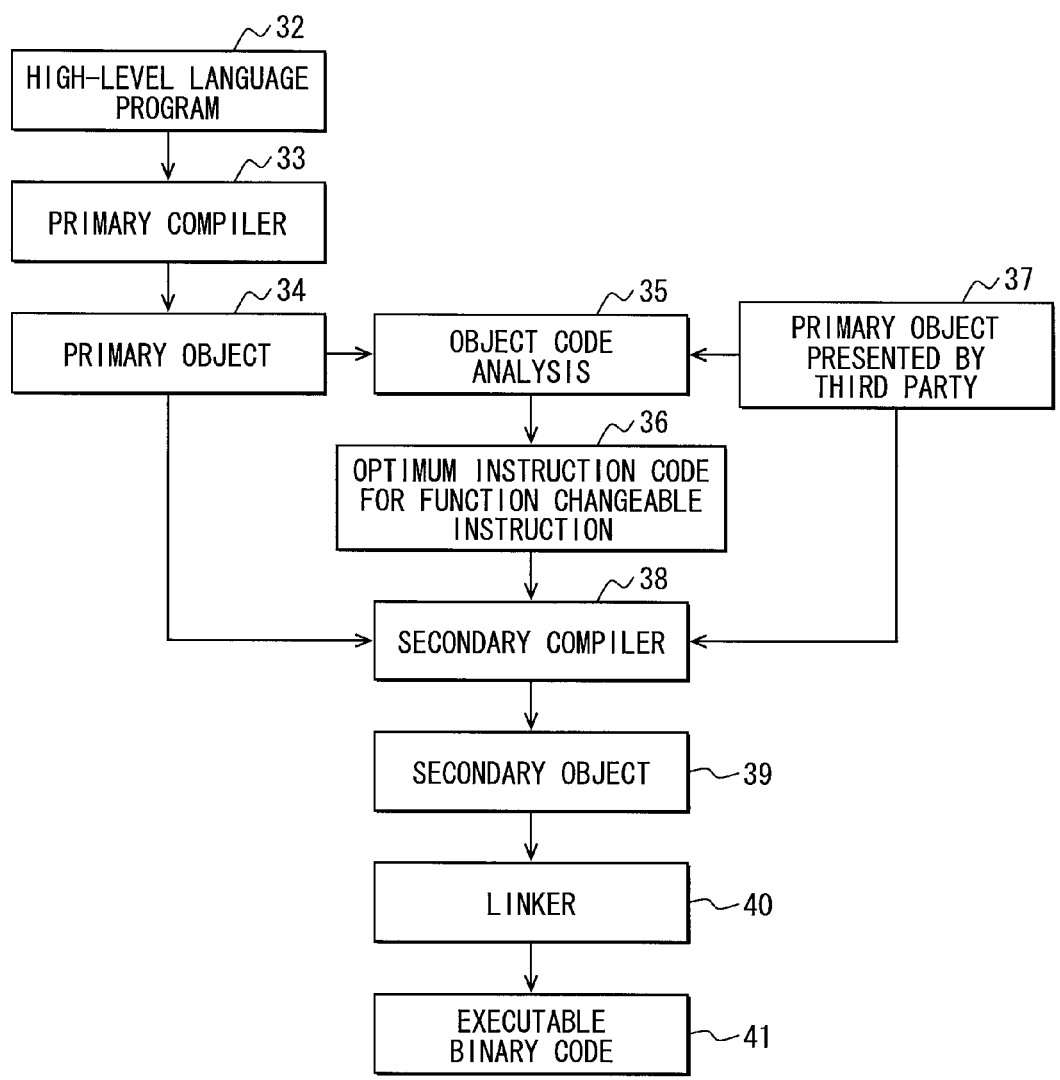
[FIG. 8]

FIG. 8 is a flowchart of a compile system in a processor having the function changeable instruction set. A source program code programmed in a high-level computer language 32 such as a C++ computer language and a JAVA language (registered trade mark) is complied by a primary compiler 33, in which only an instruction set defined as a default of a normal instruction set of the reconfigurable processor or a function changeable instruction set is used. Thus, a primary object 34 is generated. An object code analysis process 35 is performed to analyzing: information about appearance frequency, a function, a combination, an appearance order, and the like of the object codes appeared in the primary object; information about each register of the configurable processor; information about stack; information about a register file; information about a program counter; and information about a pipeline status and the like. Thus, an optimum instruction code 36 of the function changeable instruction is generated. Alternatively, it is possible to utilize a third party primary object 37 as an input of the object code analysis. The secondary compiler 38 replaces the optimum instruction code 36, of which the function is optimally changed, and the primary object 34 or the third party primary object 37 as an input with the optimum object code having a small number of steps. In the optimum object code, the optimum instruction code 36 is used, and the function is optimally defined. Further, the secondary compiler 38 executes a relocation of an address, such as a relative jump address, an absolute jump address and a reference data address, corresponding to the address of a code deleted in the replacing process. Thus, a secondary object 39 is generated. Finally, the linker 40 links the secondary object 39, so that the executable binary code 41 is generated. Here, the generated secondary object is characterized in that the secondary object has the number of steps in the object code, which is smaller than the primary object. Thus, the throughput of the processor is improved.

Figure 9:
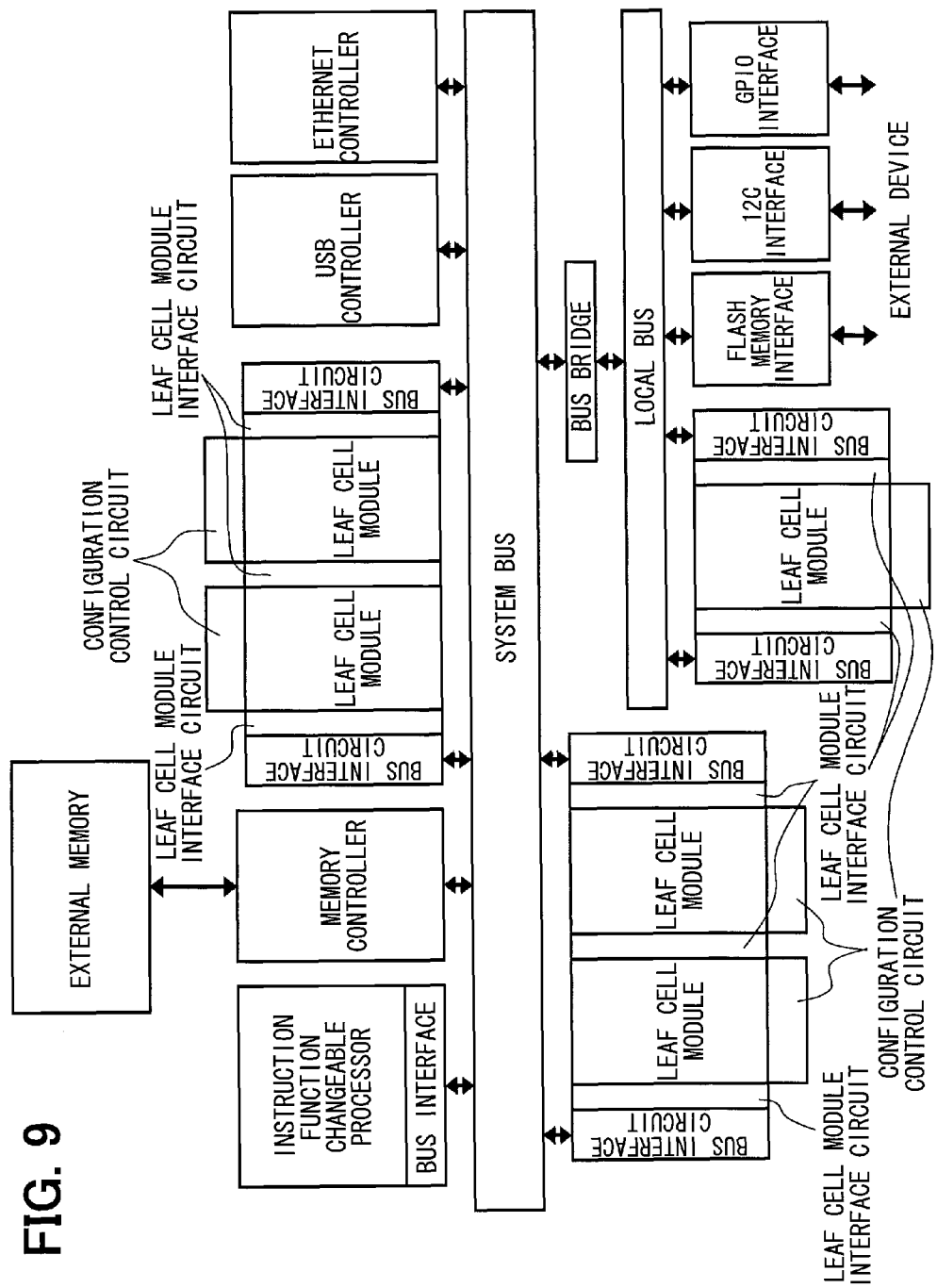
[FIG. 9]

FIG. 9 shows an example of a concrete SoC according to the present invention. In this example, the system bus is connected to one reconfigurable processor having the function changeable instruction set, two logic configurable leaf cell modules, the memory controller, the USB controller, and the Ethernet (registered trade mark). Further, the logic reconfigurable leaf cell module, the flash memory interface as the peripheral circuit, the I2C interface, and the GPIO interface are integrated with the local bus via the bus bridge.

1-2. Description of Present Invention in View of Another Aspect

The present invention will be explained as follows in view of another aspect.

The integrated circuit according to the present invention is an integrated circuit having an array, which is provided by unit cells having a predetermined shape and arranged in a matrix manner. The unit cell includes: a first input terminal, in which a first signal is input; a second input terminal, in which a second signal is input; first and second output terminals, which are disposed at positions opposing the first and second input terminals, respectively; a first logical block for receiving the first signal and the second signal and for outputting, to the first output terminal, a signal as a logic calculation result of the first signal and the second signal; the first signal and a reverse signal of the first signal; or the second signal and a reverse signal of the second signal, according to a first setting information; and a second logical block for receiving the first signal and the second signal and for outputting, to the second output terminal, a signal as a logic calculation result of the first signal and the second signal; the first signal and a reverse signal of the first signal; or the second signal and a reverse signal of the second signal, according to a second setting information.

It is preferable that the unit cell further may include a first memory element group for storing the first setting information and a second memory element group for storing the second setting information.

The first memory element group and the second memory element group are provided by multiple flip-flop circuits. It is preferable that, in these flip-flop circuits, a data wiring group for supplying the first setting information and the second setting information may be formed in a column direction. Further, it is preferable that, in these flip-flop circuits, a control signal wiring for latching the first setting information and the second setting information may be formed in a row direction.

Preferably, the first logical block may include four ternary-input logic gates, and a quaternary-input logic gate, in which the outputs from ternary-input logic gates are input. The first setting information, the first signal or the reverse signal of the first signal, and the second signal or the reverse signal of the second signal are input into each ternary-input logic gate. Preferably, the second logical block may include four ternary-input logic gates, and a quaternary-input logic gate, in which the outputs from ternary-input logic gates are input. The second setting information, the first signal or the reverse signal of the first signal, and the second signal or the reverse signal of the second signal are input into each ternary-input logic gate.

Preferably, in the array, the unit cells may be arranged at predetermined pitches in a first row, and the unit cells are arranged at the predetermined pitches and shifted by a half of the pitch in a second row adjacent to the first row. Thus, the unit cells are arranged in such a manner that the second output terminal of the unit cell in the first row is connected to the first input terminal of the unit cell in the second row, and the first output terminal of the unit cell in the first row is connected to the second input terminal of the unit cell in the second row.

Preferably, in the array, the unit cells may be arranged in N rows. The unit cells in an odd number row (i.e., a first row, a third row, . . . , and a (N−1)-th row) are arranged at predetermined pitches, and the unit cells in an even number row (i.e., a second row, a fourth row, . . . , and N-th row) are shifted by a half of the pitch and arranged at the predetermined pitches. Thus, the unit cells are arranged in such a manner that the second output terminal of the unit cell in the odd number row is connected to the first input terminal of the unit cell in the even number row, and the first output terminal of the unit cell in the odd number row is connected to the second input terminal of the unit cell in the even number row, so that the array has a sub-array. A latch circuit row provided by a latch circuit for latching the output of each unit cell in the N-th row is disposed on one end of the sub-array.

Preferably, the array further may include a feedback wiring for returning the output of the latch circuit to the first input terminal or the second input terminal of the unit cell in the first row.

In the array, the unit cells are arranged in M rows. Further, preferably, the integrated circuit may include: a bus for transmitting data; a first bus interface circuit formed along a first side of the array, and sending the data supplied from the bus to one of or both of the first input terminal and the second input terminal of the unit cell in the first row of the array; and a second bus interface circuit sending the data supplied from one of or both of the first output terminal and the second output terminal of the unit cell in the M-th row of the array to the bus.

Preferably, the integrated circuit may further include a functional block coupled with the bus and having a predetermined function.

The array has the unit cells, which are arranged in M rows. Further, preferably, the integrated circuit may include a first data bust, a second data bus, and a third data bus, which transmit data. The first data bus and the second data bus are used for inputting data. The circuit may further include a logical operation circuit for outputting a logical operation result to the third data bus. One of or both of the first input terminal and the second input terminal of the unit cell in the first row of the array are coupled with the first data bus or the second data bus. One of or both of the first output terminal and the second output terminal of the unit cell in the M-th row of the array are coupled with the third data bus.

Preferably, the integrated circuit may further include a control circuit for reconfiguring the first setting information and the second setting information dynamically.

Further, in order to achieve the above object, the present invention further provides a method of using the integrated circuit.

In the method of using the above described integrated circuit, preferably, the first setting information may be set in such a manner that the first logical block supplies the second signal or the reverse signal of the second signal to the first output terminal, or the second logical block supplies the first signal or the reverse signal of the first signal to the second output terminal. Thus, the first logical block or the second logical block provides substantially the same operation as the wiring arranged along an oblique direction. In the method of using the above described integrated circuit, preferably, the first setting information and the second setting information may be reconfigured dynamically.

In the method of using the above described integrated circuit, preferably, the first setting information and the second setting information may be set in such a manner that a failure cell is detected by testing the operation of the unit cell, and the unit cell, which is defined as the failure cell according to the detection, is bypassed.

1-3. Explanation Relating to the Mathematical Basis of the Present Invention and the Principle of the Present Invention In Boolean algebra, all of logical operations are realized by selecting appropriate $S_0$, $S_1$, $S_2$ and $S_3$ in the logic equation defined in FIG. 10.

Figures 10, 11, 12:
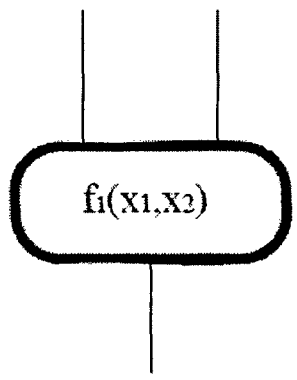
[FIG. 10]
[FIG. 11]
[FIG. 12]

As shown in FIG. 11, a logical block for outputting an output signal $f_1(x_1, x_2)$ when the block receives the input signal $x_1$(Input, $x_1$) and the input signal $x_2$(Input, $x_2$) may be mounted. When $S_0=0$, $S_1=1$, $S_2=0$, and $S_3=1$ are selected, the output signal $f_1(x_1, x_2)=x_2$ is obtained. When this selection is performed, the input signal $x_2$ is linked to the output signal, i.e., the output signal $f_1(x_1, x_2)$ as if the input signal $x_2$ is a wiring. In other words, when $S_0$, $S_1$, $S_2$, and $S_3$ are appropriately selected, the logical block can function as a wiring.

FIG. 12 shows the unit cell, which outputs two output signals according to two input signals with using two logic equations in FIG. 10. When $S_{00}$, $S_{01}$, $S_{02}$, $S_{03}$, $S_{10}$, $S_{11}$, $S_{12}$, $S_{13}$ are appropriately selected, all of combinations of logical operations are realized.

Figure 13:
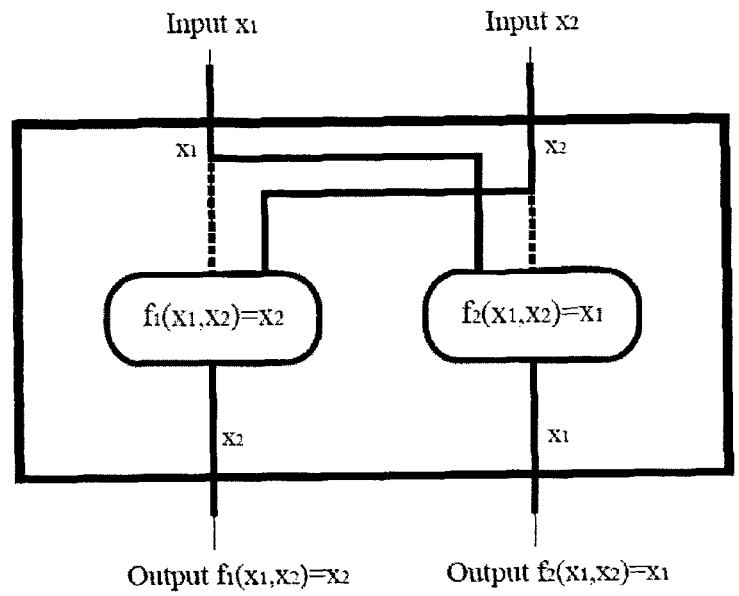
[FIG. 13]

As shown in FIG. 13, the unit cell can provide the logical operation for outputting the output signal $f_1(x_1, x_2)$ and the output signal $f_2(x_1, x_2)$ with using two logical blocks when the input signal $x_1$(Input, $x_1$) and the input signal $x_2$(Input, $x_2$) are received. Here, when $S_{00}=0$, $S_{01}=1$, $S_{02}=0$, and $S_{03}=1$ are selected, and $S_{10}=0$, $S_{11}=0$, $S_{12}=1$, and $S_{13}=1$ are selected, the output signal $f_1(x_1, x_2)=x_2$ and the output signal $f_2(x_1, x_2)=x_1$ are obtained. When these selections are performed, the input signal $x_2$ is linked to the output signal, i.e., the output signal $f_1(x_1, x_2)$ as if the input signal $x_2$ is a wiring, and the input signal $x_1$ is linked to the output signal, i.e., the output signal $f_2(x_1, x_2)$ as if the input signal $x_1$ is a wiring. In other words, when $S_{00}$, $S_{0l}$, $S_{01}$, $S_{03}$, $S_{10}$, $S_{11}$, $S_{12}$, and $S_{13}$ are appropriately selected, the logical block can function as two logical block cross wirings.

Figure 14:
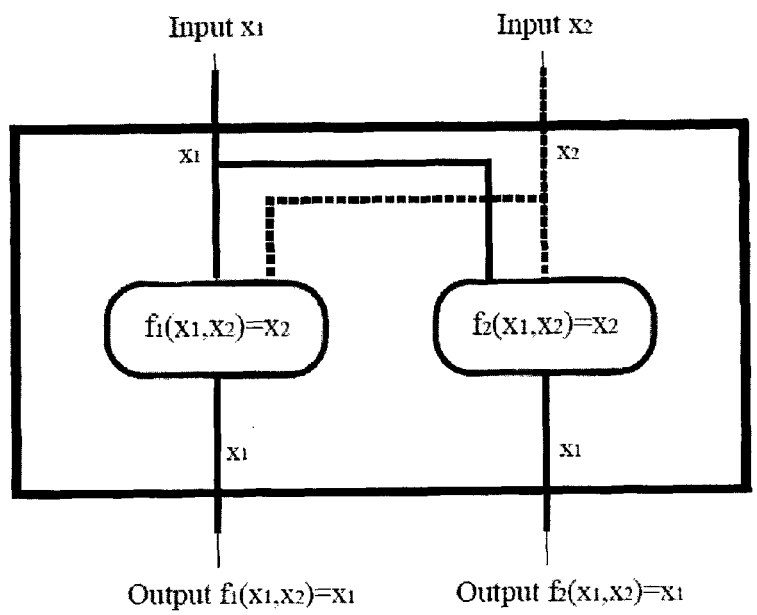
[FIG. 14]

FIG. 14 shows an example for obtaining the output signal $f_1(x_1, x_2)=x_2$ and the output signal $f_2(x_1, x_2)=x_1$ with using two logical blocks. When $S_{00}=0$, $S_{01}=1$, $S_{02}=0$, and $S_{03}=1$ are selected, and $S_{10}=1$, $S_{11}=1$, $S_{12}=0$, and $S_{13}=0$ are selected, the above logic is realized. In other words, when $S_{00}$, $S_{01}$, $S_{02}$, $S_{03}$, $S_{10}$, $S_{11}$, $S_{12}$, and $S_{13}$ are appropriately selected, two logical blocks can function as a dividing wiring of the input signal $x_2$.

Figure 15:
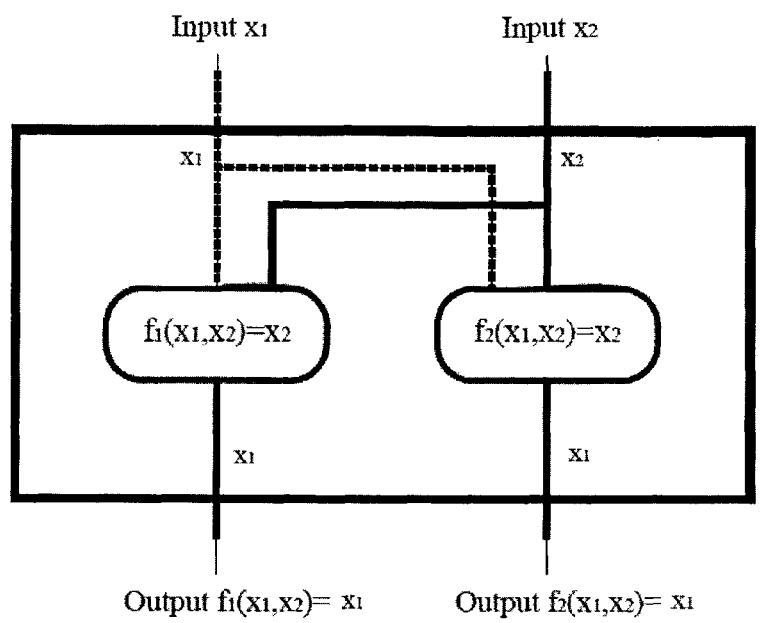
[FIG. 15]

FIG. 15 shows an example for obtaining the output signal $f_1(x_1, x_2)=x_1$ and the output signal $f_2(x_1, x_2)=x_1$ with using two logical blocks. When $S_{00}=0$, $S_{01}=0$, $S_{02}=1$, and $S_{03}=1$ are selected, and $S_{10}=0$, $S_{11}=0$, $S_{12}=1$, and $S_{13}=1$ are selected, the above logic is realized. In other words, when $S_{00}$, $S_{01}$, $S_{02}$, $S_{03}$, $S_{10}$, $S_{11}$, $S_{12}$, and $S_{13}$ are appropriately selected, two logical blocks can function as a dividing wiring of the input signal $x_1$.

Figure 16:
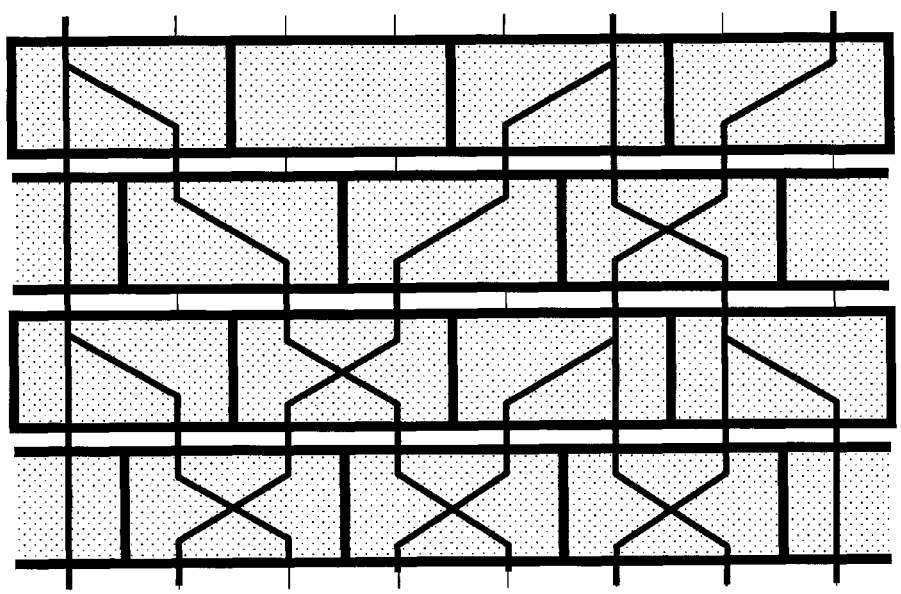
[FIG. 16]

FIG. 16 shows an example of a construction such that multiple unit cells shown in FIGS. 12 and 13 are arranged in an array manner. In this array, the unit cells in the first row and in the odd number rows are arranged at predetermined pitches. The unit cells in the second row and in the even number rows are arranged at predetermined pitches with shifting a half of the pitch.

The unit cells are arranged such that the output signals $f_2(x_1, x_2)$ of the unit cells in the first row and the odd number rows provide the input signals $x_1$ of the unit cells in the second row and the even number rows, and the output signals $f_1(x_1, x_2)$ of the unit cells in the first row and the odd number rows provide the input signals $x_2$ of the unit cells in the second row and the even number rows.

When the above construction is performed, and $S_{00}$, $S_{0l}$, $S_{02}$, $S_{03}$, $S_{10}$, $S_{11}$, $S_{12}$, and $S_{13}$ in the unit cells are appropriately selected, the unit cells function as the cross wiring (shown in FIG. 13), the dividing wiring (shown in FIGS. 14 and 15), the oblique wiring and the like, so that the unit cells can transmit the signal in the oblique direction. As a result, it is possible to eliminate the wiring region between the unit cells, which is necessary for the FPGA and the like. Thus, it is possible to reduce the area.

[Embodiments]

2-1. Construction of Logical Block

Figure 17:
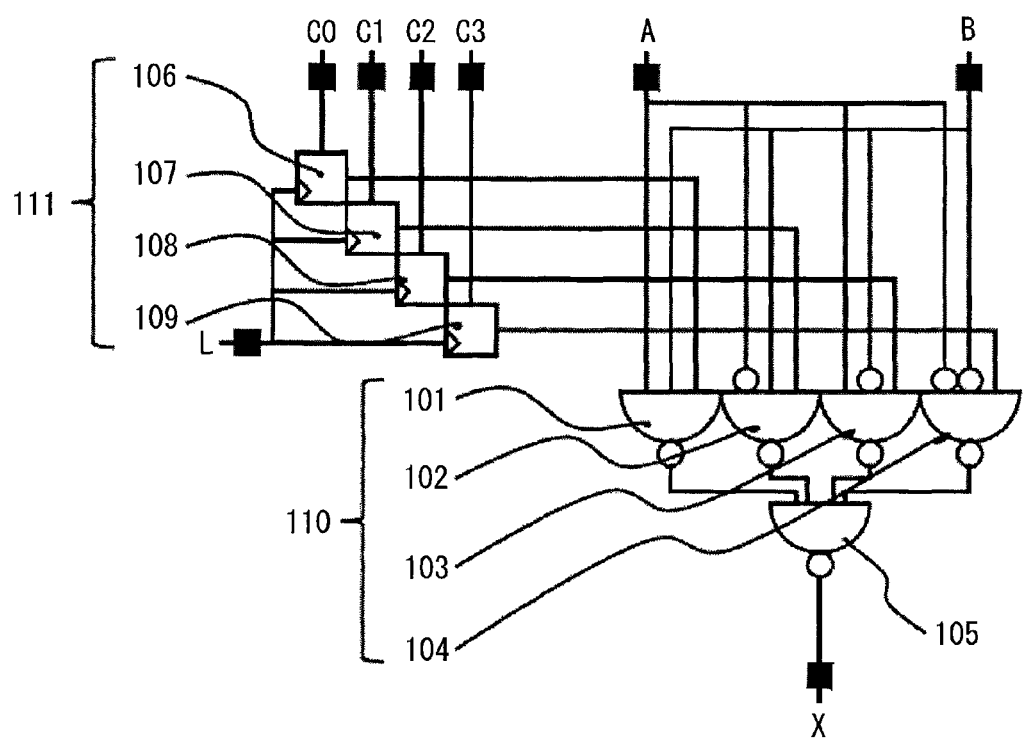
[FIG. 17]

FIG. 17 is a diagram of a gate level circuit construction for a memory element group for storing the setting information, which sets the above described logical block and the above described function of the logical block.

The logical block 110 includes four ternary-input NAND gates 101, 102, 103, 104, and a quaternary-input NAND gate 105 for receiving all of outputs from the ternary-input NAND gates 101, 102, 103, 104.

The logical equation of the output from the logical block 110 is shown in FIG. 17. Specifically, the output x according to the logical operation of the signals $c_0$, $c_1$, $c_2$, $c_3$, a, b supplied to the terminals $C_0$, $C_1$, $C_2$, $C_3$, the terminal A and the terminal B is supplied to the terminal x. Here, signals $c_0$, $c_1$, $c_2$, $c_3$ correspond to $S_0$, $S_1$, $S_2$, $S_3$, the signal a corresponds to Input, $x_1$, and the signal b corresponds to Input, $x_2$, respectively.

The memory element group 111 includes four flip-flop circuits 106, 107, 108, 109. In each circuit, data $c_0$, $c_1$, $c_2$, $c_3$ (i.e., setting information) as data of the terminals $C_0$, $C_1$, $C_2$, $C_3$ are introduced into four flip-flop circuits 106, 107, 108, 109 at time when the control signal to be supplied to the terminal L is switched from "1" (i.e., a high level) to "0" (i.e., a low level). The introduced data $c_0$, $c_1$, $c_2$, $c_3$ are transmitted to the logical block 110.

FIG. 18 is a table showing what kind of logical operation is performed by the logical block and what kind of data is output from the output terminal x according to a combination of the setting information $c_0$, $c_1$, $c_2$, $c_3$. When the setting information is "0, 0, 0, 0," the output is always zero. When the setting information is "1, 0, 0, 0," the output is a logical product of a and b. When the setting information is "0, 1, 0, 0," the output is a logical product of non-a and b. When the setting information is "1, 1, 0, 0," the output is "b" (i.e., the logical block functions as the wiring). When the setting information is "0, 0, 1, 0," the output is a logical product of a and non-b. When the setting information is "1, 0, 1, 0," the output is "a" (i.e., the logical block functions as the wiring). When the setting information is "0, 1, 1, 0," the output is an exclusive logical sum of a and b. When the setting information is "1, 1, 1, 0," the output is a logical sum of a and b. When the setting information is "0, 0, 0, 1," the output is a reverse logical sum (i.e., NOR) of a and b. When the setting information is "1, 0, 0, 1," the output is a reverse exclusive logical sum of a and b. When the setting information is "0, 1, 0, 1," the output is a non-a. When the setting information is "1, 1, 0, 1," the output is a logical sum of a and non-b. When the setting information is "0, 1, 1, 1," the output is a reverse logical product of a and b. When the setting information is "1, 1, 1, 1," the output is always "1."

2-2. Construction of Unit Cell

Figure 19:
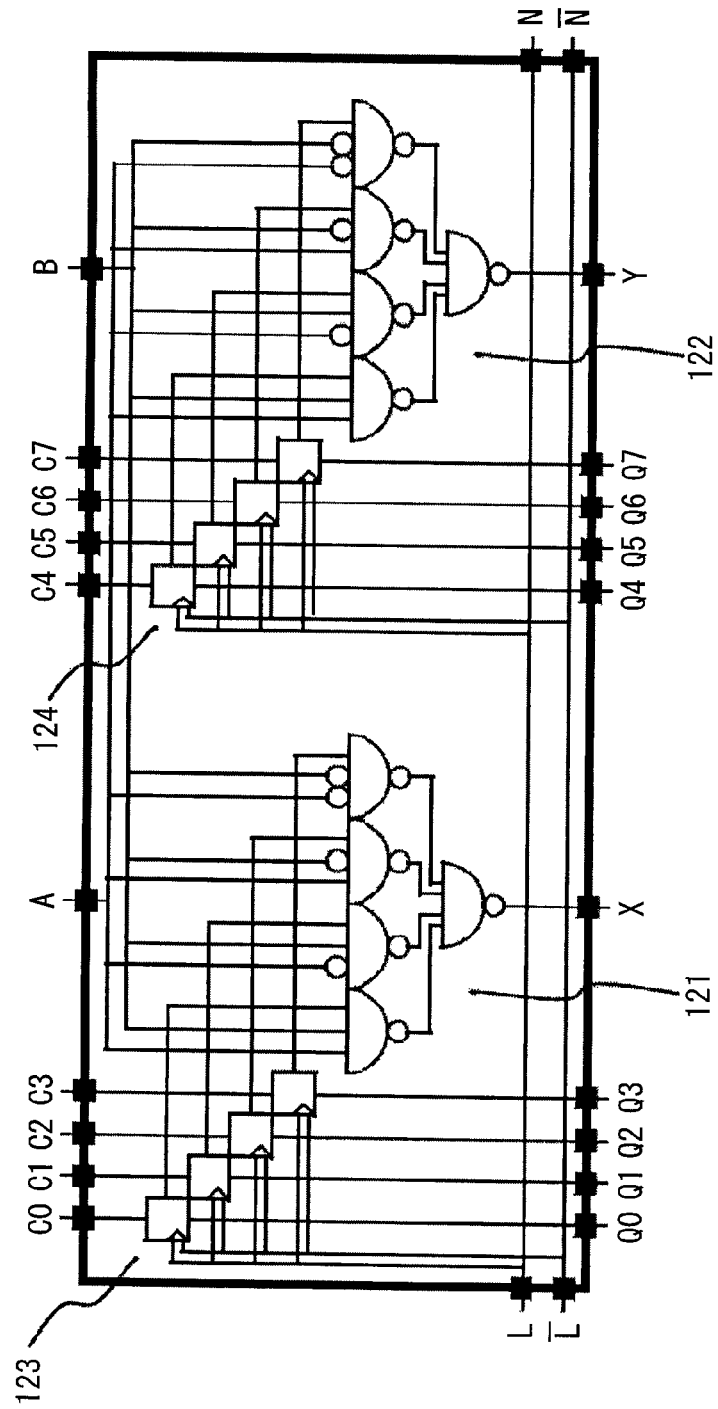
[FIG. 19]

FIG. 19 is a diagram of a gate level circuit construction for a unit cell (i.e., leaf cell).

The unit cell includes two logical blocks 121, 122 and two memory element groups 123, 124.

Each of the logical blocks 121, 122 includes four ternary-input NAND gates and a quaternary-input NAND gate, in which all of the outputs from ternary-input logic gates are input.

The logical block 121 provides the output x of the terminal x according to the logical operation of the signals $c_0, c_1, c_2, c_3$, a, b to be supplied to the terminals $C_0, C_1, C_2, C_3$, the terminal A and the terminal B.

The memory element group 123 includes four flip-flop circuits. In each circuit, data $c_0, c_1, c_2, c_3$ (i.e., setting information) as data of the terminals $C_0, C_1, C_2, C_3$ are introduced into four flip-flop circuits 106, 107, 108, 109, respectively, at time when the control signal to be supplied to the terminal L is switched from "1" (i.e., a high level) to "0" (i.e., a low level), and the control signal to be supplied to the terminal /L is switched from "0" to "1." The introduced data $c_0, c_1, c_2, c_3$ are transmitted to the logical block 121.

The logical block 122 provides the output y of the terminal y according to the logical operation of the signals $c_4, c_5, c_6, c_7$, a, b supplied to the terminals $C_4, C_5, C_6, C_7$, the terminal A and the terminal B.

The memory element group 124 includes four flip-flop circuits. In each circuit, data $c_4, c_5, c_6, c_7$ (i.e., setting information) as data of the terminals $C_4, C_5, C_6, C_7$ are introduced into four flip-flop circuits, respectively, at time when the control signal L is switched from "1" (i.e., a high level) to "0" (i.e., a low level), and the control signal /L is switched from "0" to "1" (This feature is different from the circuit in FIG. 1). The introduced data $c_4, c_5, c_6, c_7$ are transmitted to the logical block 122.

The terminals $C_0, C_1, C_2, C_3$ are coupled with the terminals $Q_0, Q_1, Q_2, Q_3$ via the wiring, which penetrates the unit cell in the up-down direction. The terminals $Q_0, Q_1, Q_2, Q_3$ are coupled with the terminals $C_4, C_5, C_6, C_7$ of the unit cell in the next row, respectively.

The terminals $C_4, C_5, C_6, C_7$ are coupled with the terminals $Q_4, Q_5, Q_6, Q_7$ via the wiring, which penetrates the unit cell in the up-down direction. The terminals $Q_4, Q_5, Q_6, Q_7$ are coupled with the terminals $C_0, C_1, C_2, C_3$ of the unit cell in the next row, respectively.

The terminal L and the terminal /L are coupled with the terminal N and the terminal /N via the wiring, which penetrates the unit cell in the right-left direction, respectively. The terminal N and the terminal /N are coupled with the terminal L and the terminal /L of the unit cell adjacent to the right side in the same row, respectively.

The unit cell has a layout of a substantially horizontally long rectangular shape. The terminals $C_0, C_1, C_2, A, C_4, C_5, C_6, C_7, B$ are arranged on a up side of the substantially rectangular shape. The terminals $Q_0, Q_1, Q_2, Q_3, X, Q_4, Q_5, Q_6, Q_7, Y$ are arranged on a down side of the substantially rectangular shape. The terminals L, /L are arranged on a left side, and the terminals N, /N are arranged on a right side.

Figure 20:
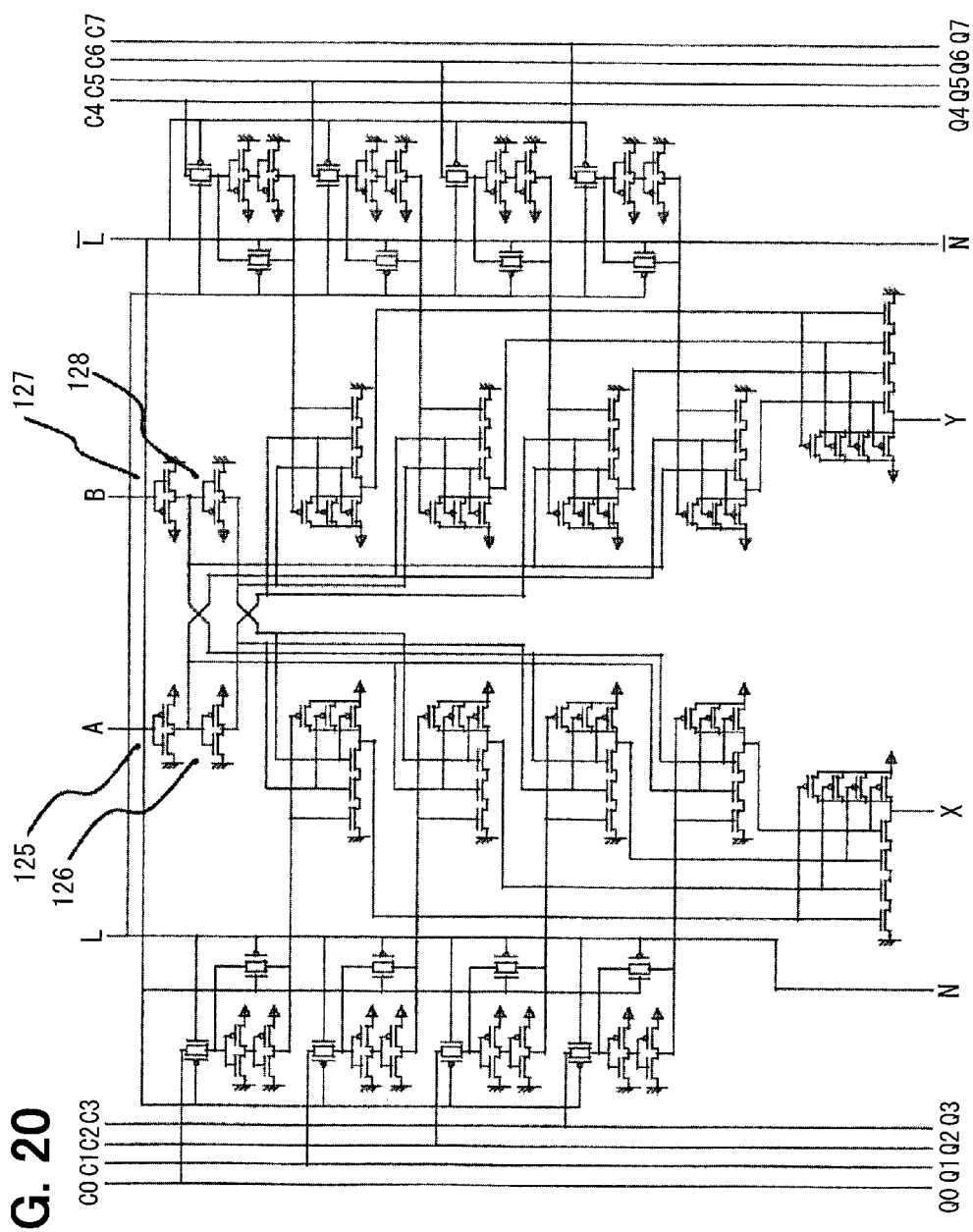
[FIG. 20]

FIG. 20 is a circuit diagram showing a transistor level of the unit cell in FIG. 19. The terminal A is coupled with the inverter 125 and the inverter 126, respectively. The terminal B is coupled with the inverter 127 and the inverter 128, respectively. The inverter 125 generates a signal /a* as a reverse signal of the signal a, which is supplied to the terminal A. The inverter 126 generates a signal a*, which is prepared by amplifying the signal a and has the same phase of the signal a. The inverter 127 generates a signal /b* as a reverse signal of the signal b, which is supplied to the terminal B. The inverter 128 generates a signal b*, which is prepared by amplifying the signal b and has the same phase of the signal b. The signals /a*, a*, /b*, b* are selectively input into multiple ternary-input NAND gates.

2-3. Construction of Array

Figure 21:
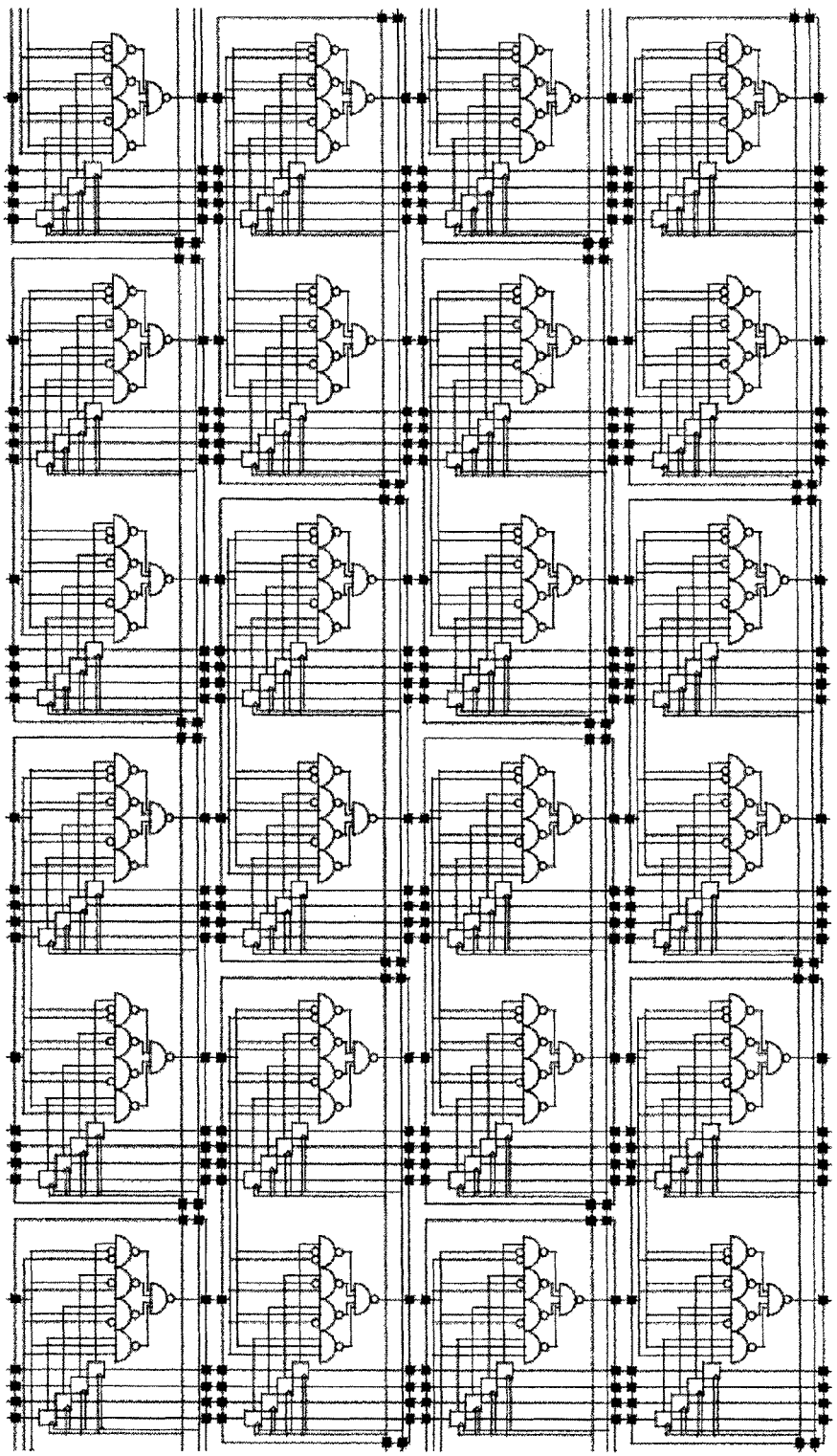
[FIG. 21]

FIG. 21 is a circuit diagram showing a transistor level of the array, in which the unit cells in FIG. 20 are arranged in a matrix manner by shifting the cells by a half of a pitch in each row, as shown in FIG. 16. This construction realizes a wide variety of a combination of the logical circuits. Since the wiring in the oblique direction is realized by the logical block, a conventional wiring region and a conventional connection region are not necessary, so that a small reconfigurable circuit is obtained.

Figure 22:
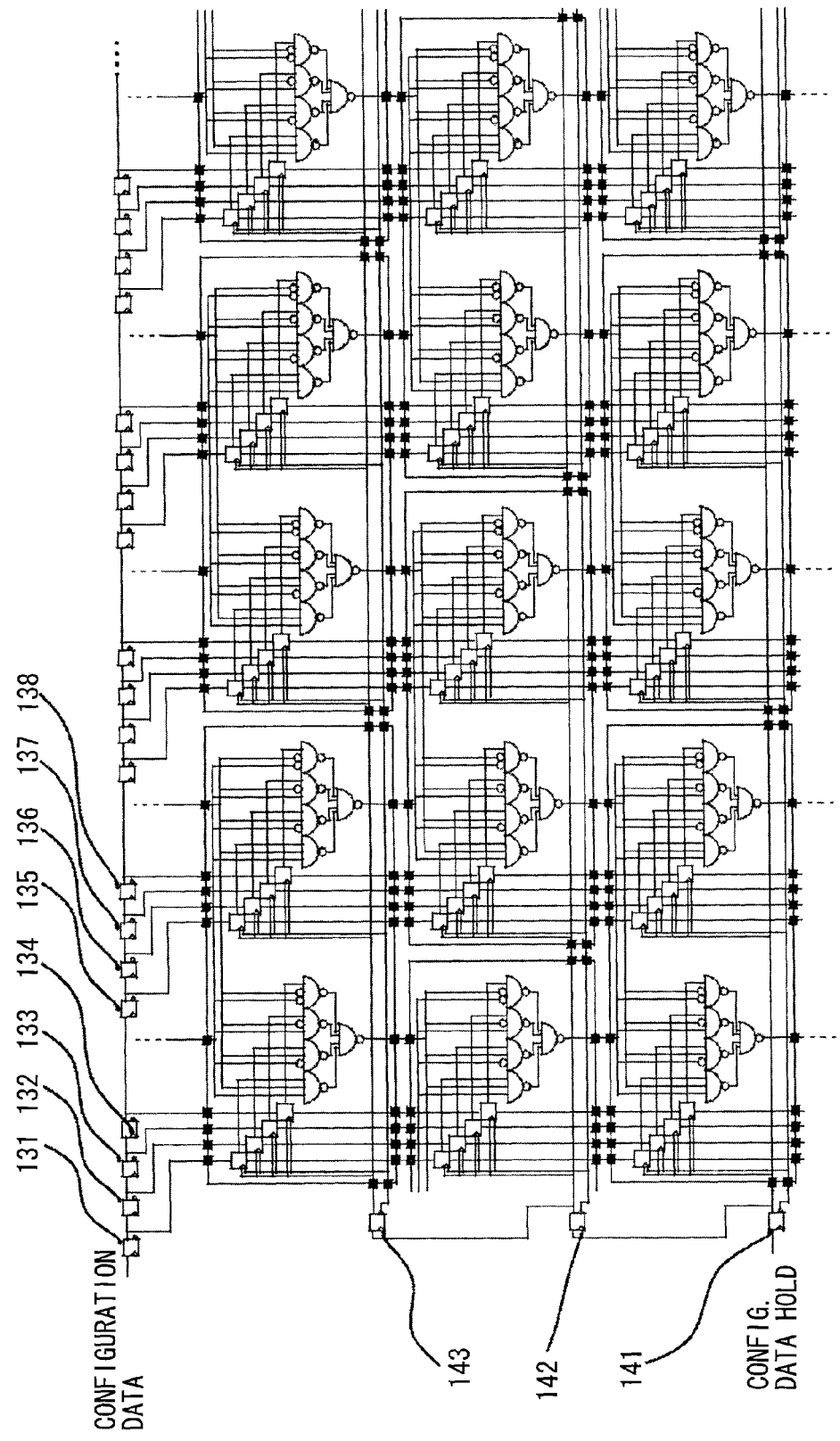
[FIG. 22]

FIG. 22 shows a circuit for supplying the setting information $c_0, c_1, c_2, c_3, c_4, c_5, c_6, c_7$ to each unit cell.

Flip-flop circuits 131-138 corresponding to the terminals $C_0, C_1, C_2, C_3, C_4, C_5, C_6, C_7$ are formed. These flip-flop circuits 131-138 provide a shift register. The setting information is supplied from the left end CD (i.e., configuration data) terminal serially. The data shift is performed by toggling the control signal to be supplied to the clock signal terminal not shown in the drawings.

Further, Flip-flop circuits 141, 142, 143, . . . corresponding to the terminals L. /L in each row are formed. These flip-flop circuits provide a shift register. Each of setting information is set in the unit cell in order from the last row by transmitting in turn the pulse signal from the left end CH (configuration date hold) terminal to the unit cells from the down side row to the up side row of the array.

2-4. Modifications of Unit Cell and Array

Figure 23:
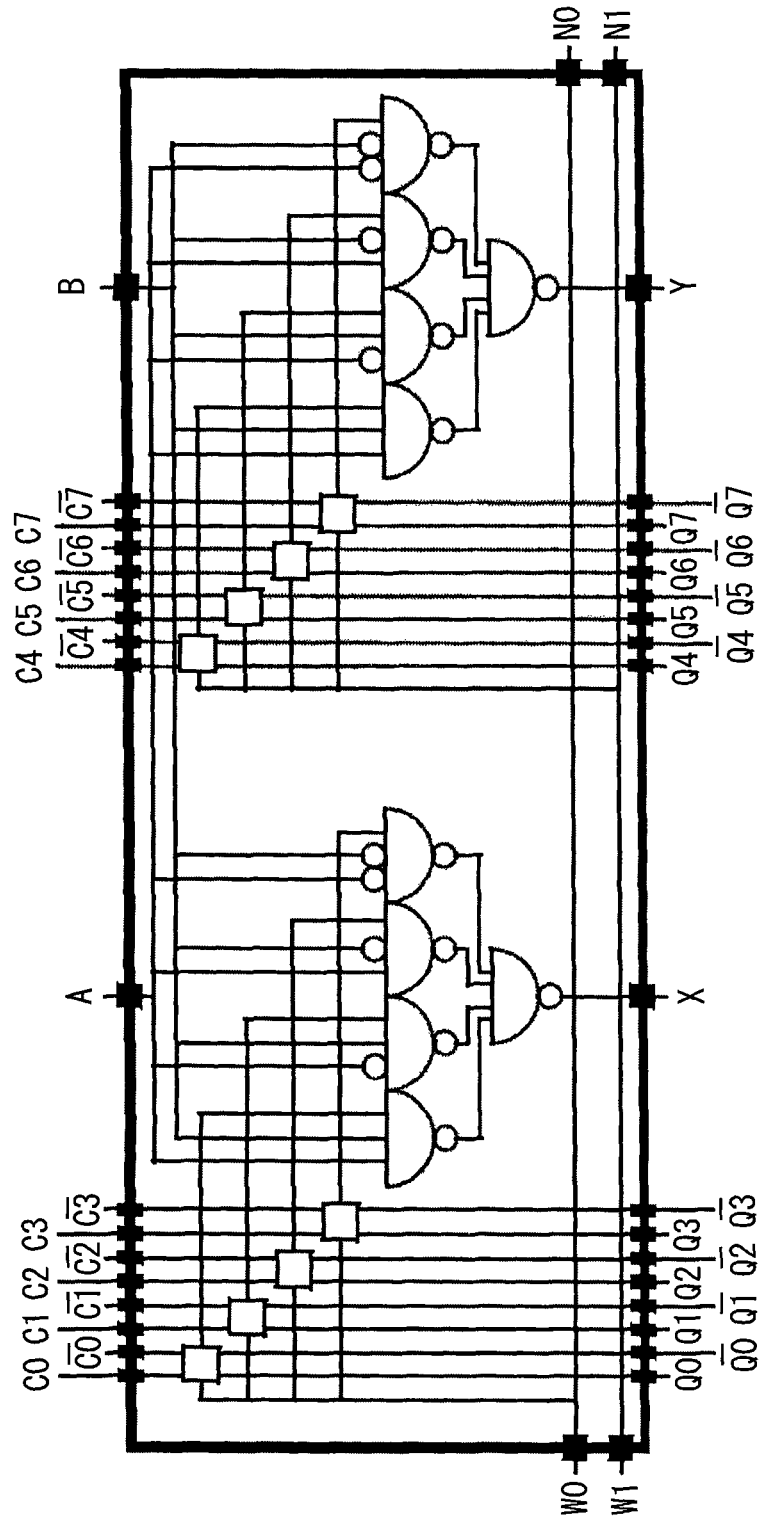
[FIG. 23]

FIG. 23 is a diagram showing a circuit construction of the gate level of the unit cell (i.e., leaf cell) according to a modification.

A difference from the circuit in FIG. 19 is such that the terminals for supplying the signals $c_0, c_1, c_2, c_3$ include the terminals $C_0, /C_0, C_1, /C_1, C_2, /C_2, C_3, /C_3$, so that a complementary signal is supplied. Further, the terminals for supplying the signals $c_4, c_5, c_6, c_7$ include the terminals $C_4, /C_4/C_5, /C_5/C_6, /C_6, C_7/C_7$, so that a complementary signal is supplied.

Figure 24:
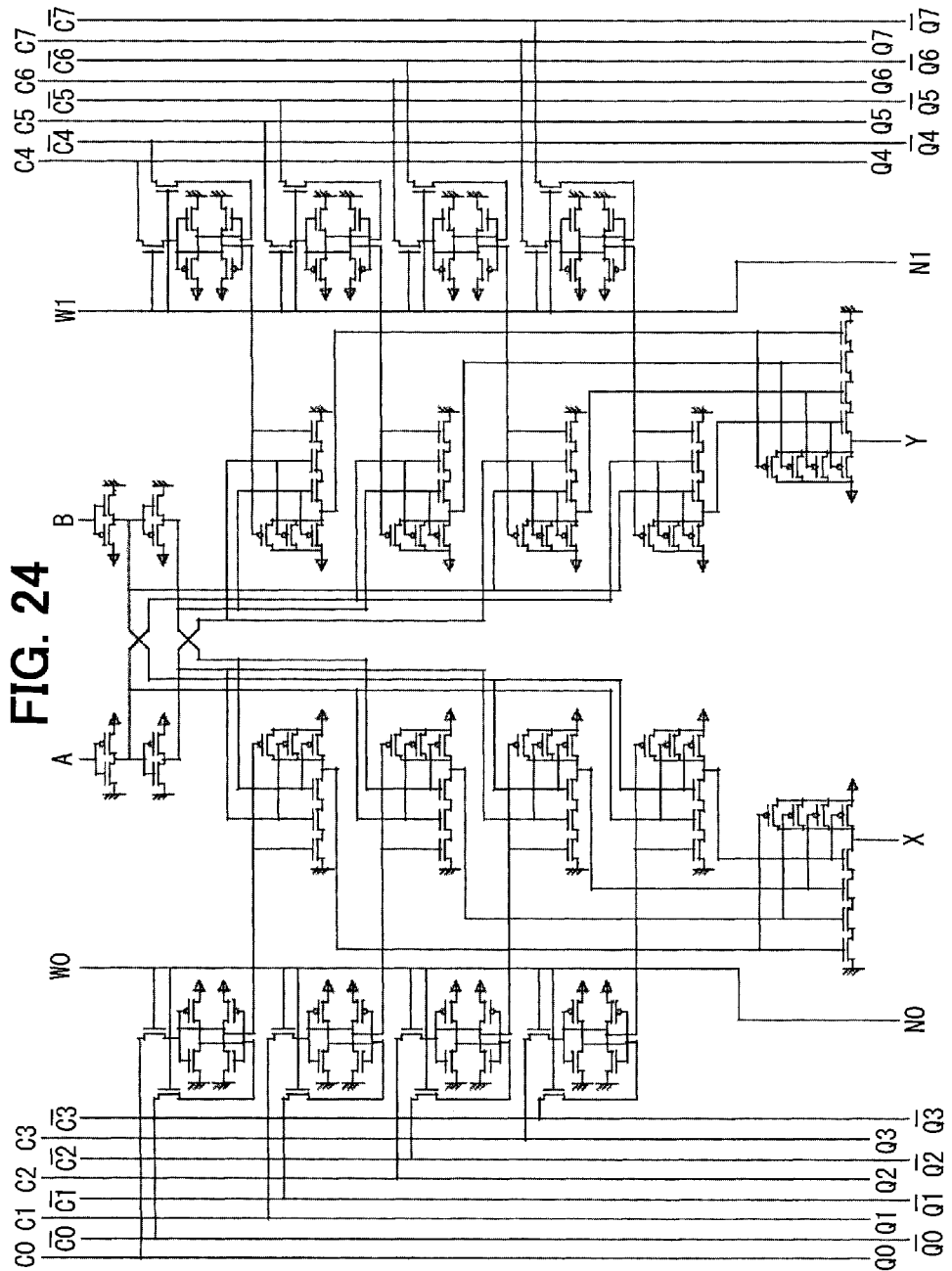
[FIG. 24]

FIG. 24 is a circuit diagram showing a transistor level of the unit cell in FIG. 23. When the setting information is supplied with using the complementary signal, the number of transistors in the flip-flop circuit is reduced.

Figure 25:
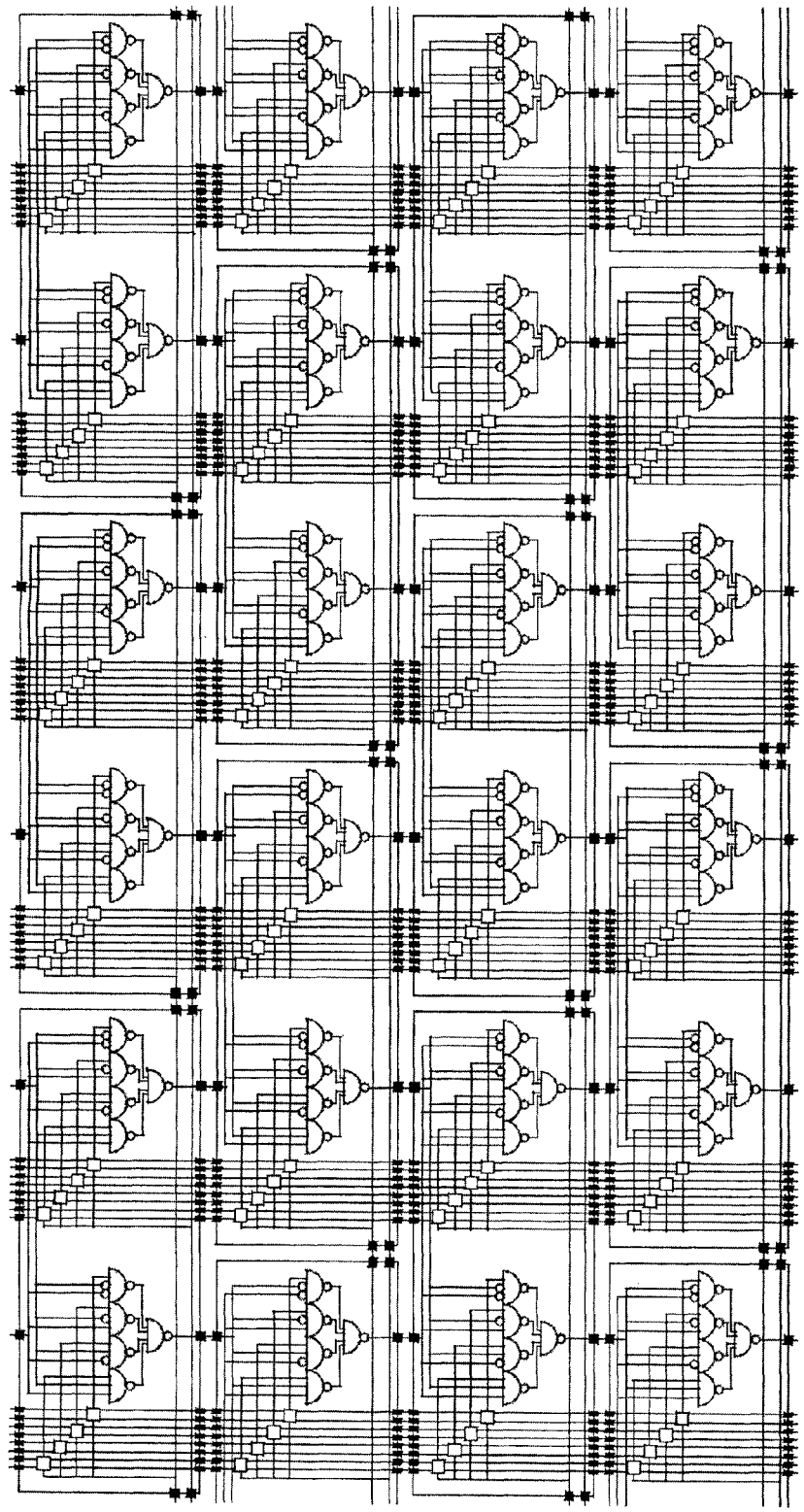
[FIG. 25]

FIG. 25 is a circuit diagram showing the transistor level of the array, in which the unit cells in FIG. 23 are arranged in a matrix manner by shifting the unit cells by a half of the pitch in each row.

Figure 26:
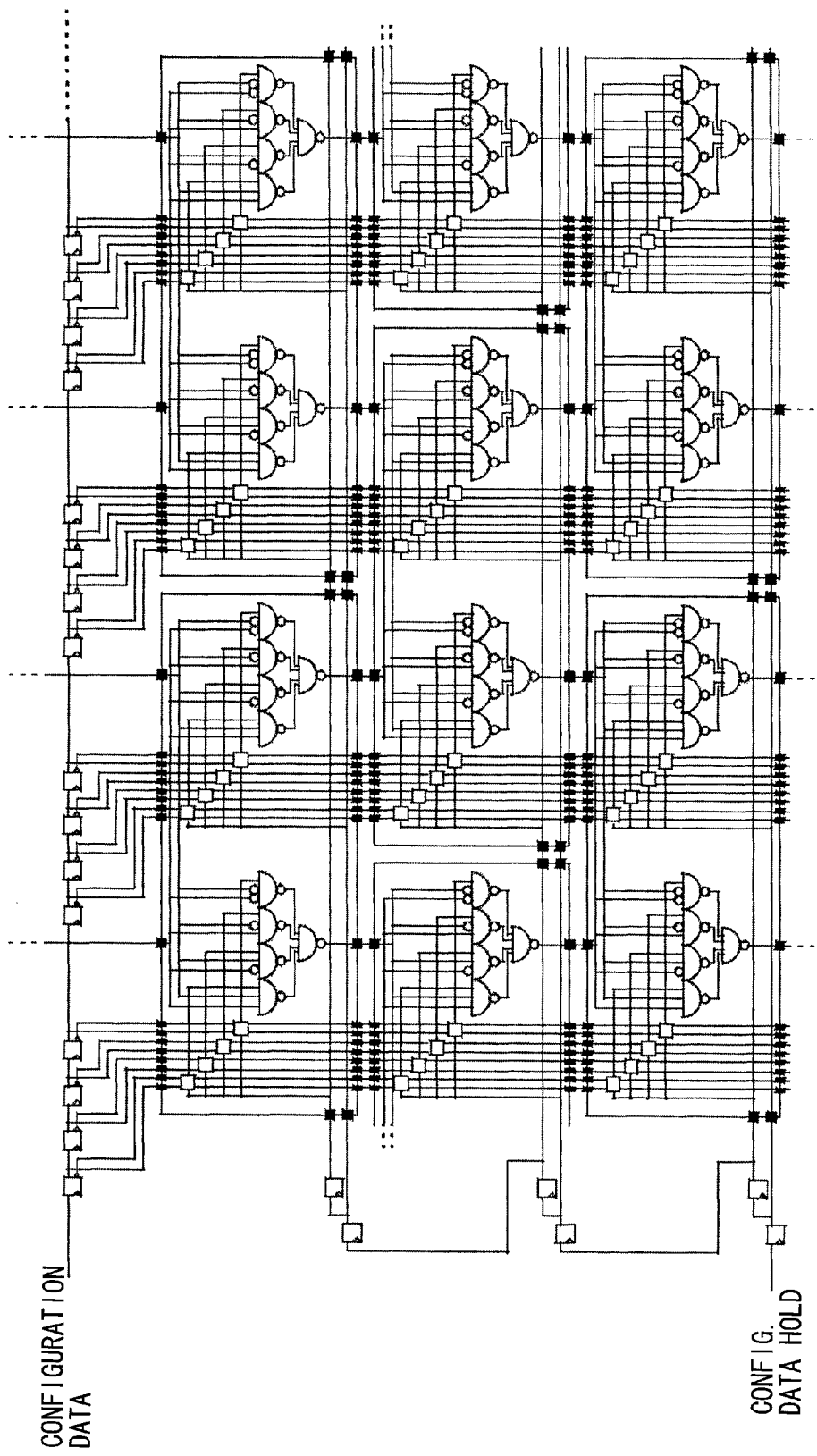
[FIG. 26]

FIG. 26 shows a circuit for supplying the setting information $c_0, /c_0, c_1, /c_1, c_2, /c_2, c_3, /c_3, c_4, /c_4, c_5, /c_5, c_6, /c_6, c_7, /c_7$ to each unit cell in FIG. 23. The complementary outputs of the flip-flop circuit are supplied, respectively.

Figure 27:
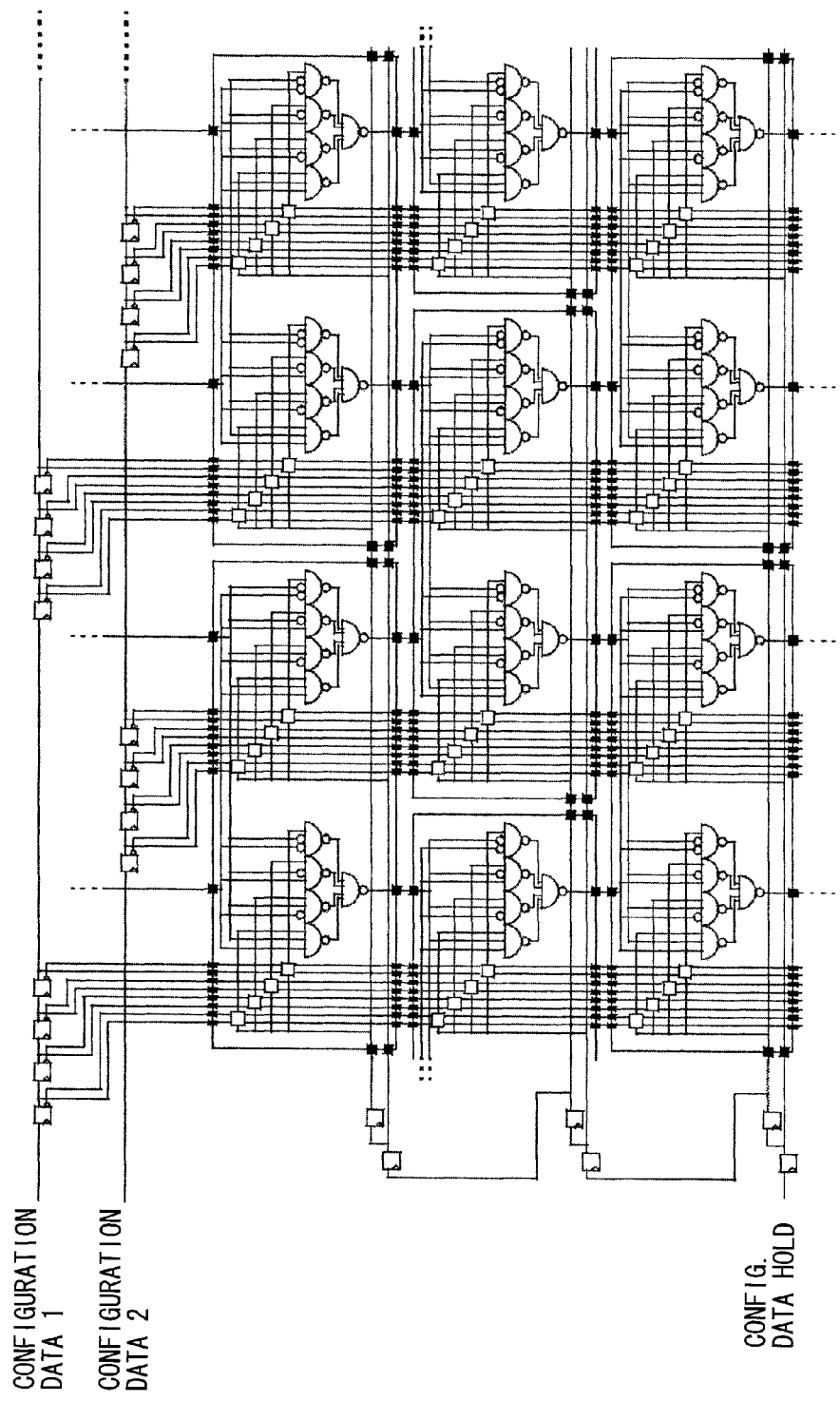
[FIG. 27]
Figure 28:
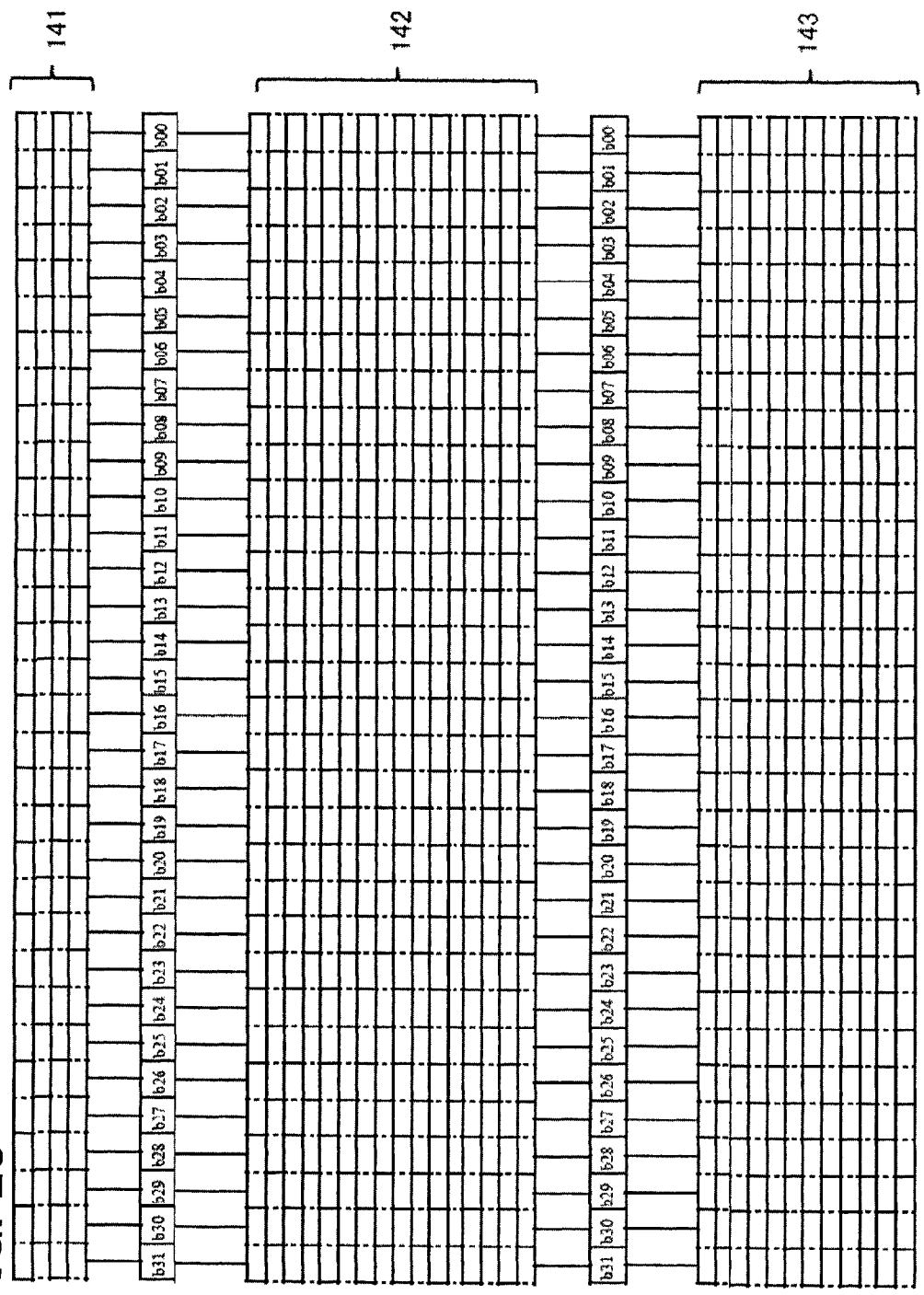
[FIG. 28]

FIG. 27 shows another circuit for supplying the setting information $c_0, /c_0, c_1, /c_1, c_2, /c_2, c_3, /c_3, c_4, /c_4, c_5, /c_5, c_6, /c_6,$ $c_7$, /$c_7$ to each unit cell in FIG. 23. The configuration data CONFIGURATION DATA is divided into a line (CONFIGURATION DATA 1) for setting the left side memory element group in the unit cell and a line (CONFIGURATION DATA 2) for setting the right side memory element group in the unit cell. This construction provides to execute the update of the setting information rapidly.

2-5. Feedback Circuit

As explained in FIG. 3, the array includes multiple sub-arrays, which are arranged in a column direction. It is possible to insert the feedback circuit between the sub-arrays.

FIG. 27 shows an example of the array, in which the feedback circuits b00-b31 are inserted.

The array includes the sub-arrays 141, 412, 143..., and the sub-array includes the unit cells in sixteen rows. The number of feedback circuits is twice larger than the number of unit cells. The feedback circuit is coupled between the output terminal X and the output terminal Y of the unit cell in the last row of the sub-array. The construction of the feedback circuit is the same as the circuit explained in FIG. 3. The feedback circuit includes the flip-flop circuit 13, the data signal selector 12 on a previous step, and the feedback signal selector 11. Further, in the feedback circuit, the element group for storing the setting information and the signal lines for sending the setting information are disposed.

Figure 29:
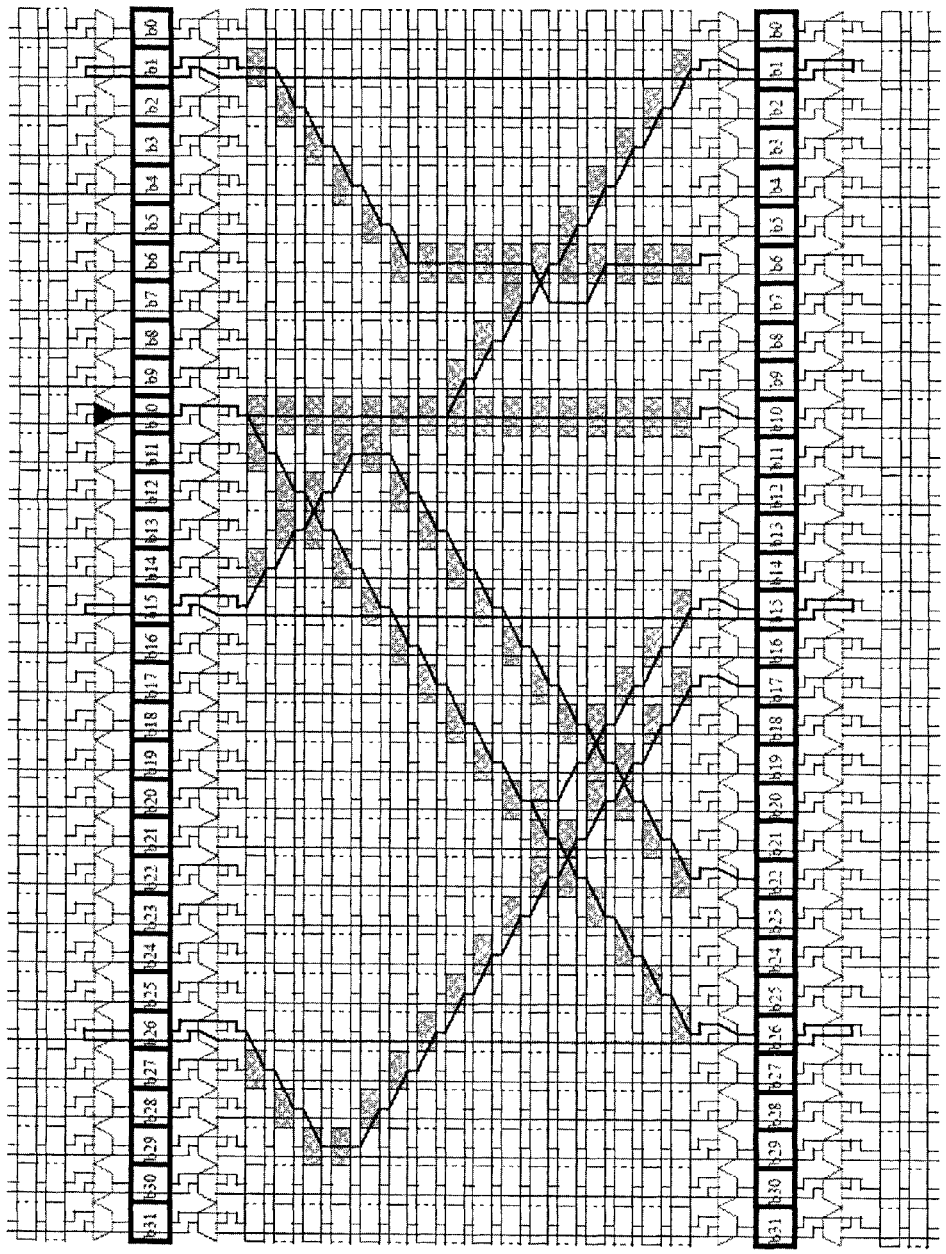
[FIG. 29]

FIG. 29 shows an example of a circuit, in which the unit cells function as a vertical wiring, an oblique wiring, a dividing wiring and the like, and the feedback circuit is also utilized.

Figure 30:
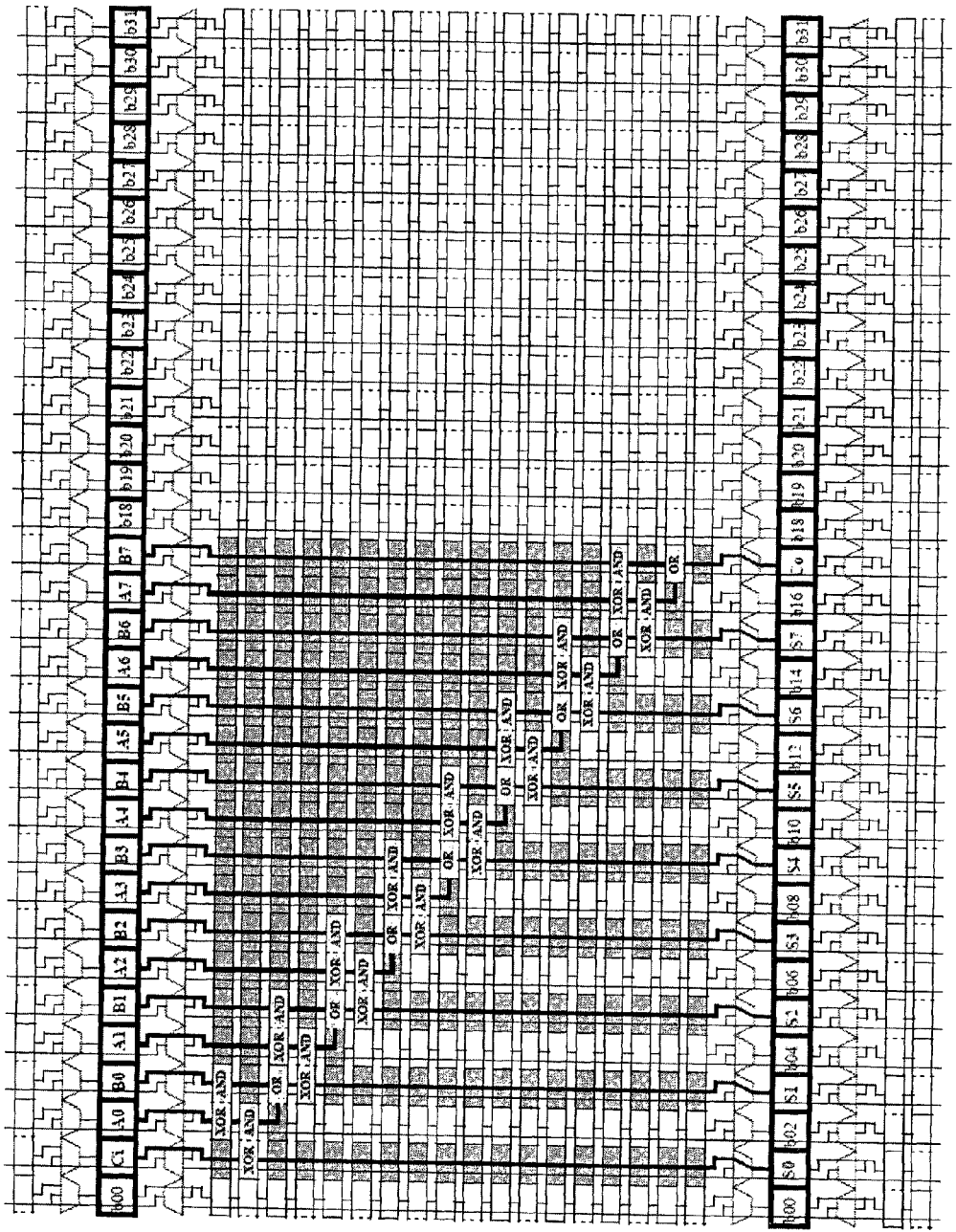
[FIG. 30]

FIG. 30 shows an example of an adder with a 8-bit carry, in which the unit cells function as a vertical wiring, XOR (exclusive logical sum), AND (logical product), OR (logical sum) and the like, and the feedback circuit is also utilized.

Figure 31:
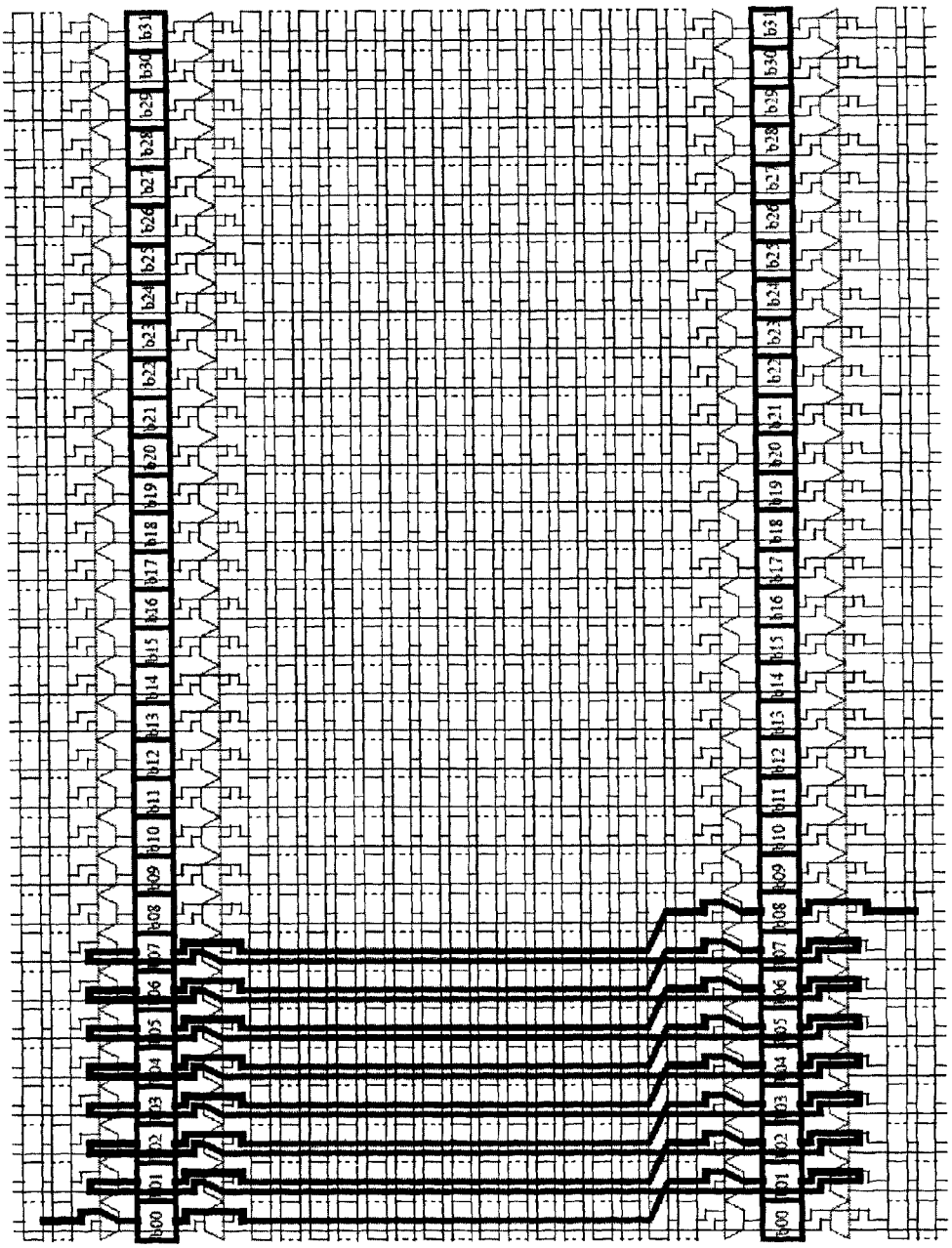
[FIG. 31]

FIG. 31 shows an example of a shift register, in which the unit cells function as a vertical wiring and an oblique wiring, and the feedback circuit is also utilized.

2-6. System with Using Unit Cell (Leaf Cell)

The system with using the leaf cell explained in FIGS. 4 to 9 is similarly used for the present embodiment.

2-7. Test for Unit Cell

Preferably, the above described array with using the unit cells may be used as follows.

First, it is conformed according to the following method whether all of the unit cells function.

All of patterns or degenerated patterns (i.e., patterns of a subset, which provides to detect all of patterns substantially) in each of the setting information $c_0$, $c_1$, $c_2$, $c_3$, $c_4$, $c_5$, $c_6$, $c_7$ are supplied to each unit cell, so that the operation of each unit cell is confirmed.

When the operation is different from a required operation, the failure cell is specified according to the relationship between the above pattern and the output. This provides a failure cell specifying routine.

Actually, when the circuit generation is performed, the setting information is set in such a manner that the unit cell, which is defined as the failure cell, is bypassed. When the setting information is set, it is possible to utilize the cell array even if the cell array includes the failure cell.

[Industrial Applicability]

It is possible to provide an integrated circuit capable of improving all of issues such as a chip area, a cost, a logic change function, an operating frequency, flexibility, a throughout and an electric power consumption, and to provide a reconfigurable processor capable of changing an instruction function.

DESCRIPTION OF NUMERALS

1: Logic reconfiguration element
2: Logic configuration memory element
3: Logic data signal channel
4: Logic configuration data channel
5: Control signal channel in logic configuration memory element
6: Input/output signal terminal
7: Logic reconfigurable leaf cell
8: Logic data signal selector
9: Memory element such as flip-flop circuit or latch circuit
10: Feedback signal selector
11: Feedback signal selector on previous step
12: Logic data signal selector on previous step
13: Memory element such as flip-flop circuit or latch circuit on previous step
14: Logic reconfigurable leaf cell module
15: Leaf cell module interface circuit
16: Logic configuration control circuit
17: System bus or local bus
18: Bus interface circuit
19: Logic reconfigurable leaf cell module
20: ALU
21: Control unit
22: Instruction function change control circuit
23: Leaf cell module configuration control circuit
24: System bus
25: reconfigurable processor
26: Complex leaf cell module
27: memory controller
28: Bus bridge
29: Local bus
30: Logic reconfigurable leaf cell module
31: Peripheral
32: High-level computer language
33: Primary compiler
34: Primary object
35: Object code analysis process
36: Optimum instruction code in function changeable instruction
37: Third party primary object
38: Secondary compiler
49: Secondary object
40: linker
41: Executable binary code

The invention claimed is:

1. An integrated circuit comprising:
an array, which is provided by a plurality of unit cells having a predetermined shape and arranged in a matrix manner,
wherein each unit cell includes:
a first input terminal, to which a first signal is supplied;
a second input terminal, to which a second signal is supplied;
first and second output terminals, which are disposed to face the first and second input terminals, respectively;
a first logical block for supplying one of a signal relating to a logical operation result of the first signal and the second signal according to first setting information, the first signal or a reverse signal of the first signal, and the second signal or a reverse signal of the second signal to the first output terminal when receiving the first signal and the second signal;
a second logical block for supplying one of a signal relating to a logical operation result of the first signal and the second signal according to second setting information, the first signal or the reverse signal of the first signal, and the second signal or the reverse signal of the second signal to the second output terminal when receiving the first signal and the second signal;

a first memory element group for storing the first setting information; and
a second memory element group for storing the second setting information,
wherein each of the first memory element group and the second memory element group includes a plurality of flip-flop circuits,
wherein a data wiring group for supplying the first setting information and the second setting information to the flip-flop circuits is arranged along a column direction, and
wherein a control signal wiring for latching the first setting information and the second setting information at the flip-flop circuits is arranged along a row direction.

2. The integrated circuit according to claim 1
wherein the array is provided by the unit cells, which are arranged in M rows,
the integrated circuit further comprising:
a bus for transmitting data;
a first bus interface circuit disposed along with a first side of the array and inputting data supplied from the bus into one of or both of the first input terminal and the second input terminal of the unit cell in the first row of the array; and
a second bus interface circuit inputting data supplied from one of or both of the first output terminal and the second output terminal of the unit cell in the M-th row of the array to the bus.

3. The integrated circuit according to claim 2 further comprising:
a functional block coupled with the bus and having a predetermined function.

4. The integrated circuit according to claim 1
wherein the array is provided by the unit cells, which are arranged in M rows,
the integrated circuit further comprising:
a first data bus, a second data bus and a third data bus, each of which transmits data; and
a logical operation circuit for receiving data from the first data bus and the second data bus and for outputting a logical operation result to the third bus,
wherein one of or both of the first input terminal and the second input terminal of the unit cell in the first row of the array is coupled with the first data bus or the second data bus, and
wherein one of or both of the first output terminal and the second output terminal of the unit cell in the M-th row of the array is coupled with the third data bus.

5. The integrated circuit according to claim 1 further comprising:
a control circuit for reconfiguring the first setting information and the second setting information dynamically.

6. A method of using the integrated circuit according to claim 1, comprising:
setting the first setting information in such a manner that the first logical block supplies one of the second signal and the reverse signal of the second signal to the first output terminal, or setting the first setting information in such a manner that the second logical block supplies one of the first signal and the reverse signal of the first signal to the second output terminal, so that the first logical block or the second logical block provides substantially a same function as a wiring arranged in an oblique direction.

7. A method of using the integrated circuit according to claim 1, comprising:
dynamically reconfiguring the first setting information and the second setting information.

8. An integrated circuit comprising:
an array, which is provided by a plurality of unit cells having a predetermined shape and arranged in a matrix manner,
wherein each unit cell includes:
a first input terminal, to which a first signal is supplied;
a second input terminal, to which a second signal is supplied;
first and second output terminals, which are disposed to face the first and second input terminals, respectively;
a first logical block for supplying one of a signal relating to a logical operation result of the first signal and the second signal according to first setting information, the first signal or a reverse signal of the first signal, and the second signal or a reverse signal of the second signal to the first output terminal when receiving the first signal and the second signal; and
a second logical block for supplying one of a signal relating to a logical operation result of the first signal and the second signal according to second setting information, the first signal or the reverse signal of the first signal, and the second signal or the reverse signal of the second signal to the second output terminal when receiving the first signal and the second signal,
wherein the first logical block includes four ternary-input logic gates, and a quaternary-input logic gate, in which outputs from ternary-input logic gates are input,
wherein the first setting information, the first signal or the reverse signal of the first signal, and the second signal or the reverse signal of the second signal are input into each of the ternary-input logic gates,
wherein the second logical block includes four ternary-input logic gates, and a quaternary-input logic gate, in which outputs from ternary-input logic gates are input, and
wherein the second setting information, the first signal or the reverse signal of the first signal, and the second signal or the reverse signal of the second signal are input into each of the ternary-input logic gates.

9. The integrated circuit according to claim 8
wherein the array is provided by the unit cells, which are arranged in M rows,
the integrated circuit further comprising:
a bus for transmitting data;
a first bus interface circuit disposed along with a first side of the array and inputting data supplied from the bus into one of or both of the first input terminal and the second input terminal of the unit cell in the first row of the array; and
a second bus interface circuit inputting data supplied from one of or both of the first output terminal and the second output terminal of the unit cell in the M-th row of the array to the bus.

10. The integrated circuit according to claim 8
wherein the array is provided by the unit cells, which are arranged in M rows,
the integrated circuit further comprising:
a first data bus, a second data bus and a third data bus, each of which transmits data; and
a logical operation circuit for receiving data from the first data bus and the second data bus and for outputting a logical operation result to the third bus, wherein one of or both of the first input terminal and the second input terminal of the unit cell in the first row of the array is coupled with the first data bus or the second data bus, and wherein one of or both of the first output terminal and the second output terminal of the unit cell in the M-th row of the array is coupled with the third data bus.

11. The integrated circuit according to claim 8 further comprising:

a control circuit for reconfiguring the first setting information and the second setting information dynamically.

12. An integrated circuit comprising:

an array, which is provided by a plurality of unit cells having a predetermined shape and arranged in a matrix manner, wherein each unit cell includes:
  a first input terminal, to which a first signal is supplied;
  a second input terminal, to which a second signal is supplied;
  first and second output terminals, which are disposed to face the first and second input terminals, respectively;
  a first logical block for supplying one of a signal relating to a logical operation result of the first signal and the second signal according to first setting information, the first signal or a reverse signal of the first signal, and the second signal or a reverse signal of the second signal to the first output terminal when receiving the first signal and the second signal; and
  a second logical block for supplying one of a signal relating to a logical operation result of the first signal and the second signal according to second setting information, the first signal or the reverse signal of the first signal, and the second signal or the reverse signal of the second signal to the second output terminal when receiving the first signal and the second signal, and wherein the array is provided by the unit cells, which are arranged in such a manner that the unit cells in a first row are arranged at predetermined pitches, and the unit cells in a second row adjacent to the first row are arranged at the predetermined pitches and shifted by a half of the pitch, so that the second output terminal of the unit cell in the first row is coupled with the first input terminal of the unit cell in the second row, and the first output terminal of the unit cell in the first row is coupled with the second input terminal of the unit cell in the second row.

13. The integrated circuit according to claim 12 wherein the array is provided by the unit cells, which are arranged in M rows, the integrated circuit further comprising:

a bus for transmitting data;

a first bus interface circuit disposed along with a first side of the array and inputting data supplied from the bus into one of or both of the first input terminal and the second input terminal of the unit cell in the first row of the array; and a second bus interface circuit inputting data supplied from one of or both of the first output terminal and the second output terminal of the unit cell in the M-th row of the array to the bus.

14. The integrated circuit according to claim 12 wherein the array is provided by the unit cells, which are arranged in M rows, the integrated circuit further comprising:

a first data bus, a second data bus and a third data bus, each of which transmits data; and a logical operation circuit for receiving data from the first data bus and the second data bus and for outputting a logical operation result to the third bus, wherein one of or both of the first input terminal and the second input terminal of the unit cell in the first row of the array is coupled with the first data bus or the second data bus, and wherein one of or both of the first output terminal and the second output terminal of the unit cell in the M-th row of the array is coupled with the third data bus.

15. The integrated circuit according to claim 12 further comprising:

a control circuit for reconfiguring the first setting information and the second setting information dynamically.

16. An integrated circuit according to claim 1 comprising:

an array, which is provided by a plurality of unit cells having a predetermined shape and arranged in a matrix manner, wherein each unit cell includes:
  a first input terminal, to which a first signal is supplied;
  a second input terminal, to which a second signal is supplied;
  first and second output terminals, which are disposed to face the first and second input terminals, respectively;
  a first logical block for supplying one of a signal relating to a logical operation result of the first signal and the second signal according to first setting information, the first signal or a reverse signal of the first signal, and the second signal or a reverse signal of the second signal to the first output terminal when receiving the first signal and the second signal; and
  a second logical block for supplying one of a signal relating to a logical operation result of the first signal and the second signal according to second setting information, the first signal or the reverse signal of the first signal, and the second signal or the reverse signal of the second signal to the second output terminal when receiving the first signal and the second signal, wherein the array further includes a sub-array provided by the unit cells, which are arranged in such a manner that the unit cells are arranged in N rows, the unit cells in odd number rows are arranged at predetermined pitches, and the unit cells in even number rows are arranged at the predetermined pitches with shifting a half of the pitch, so that the second output terminal of the unit cell in the odd number row is coupled with the first input terminal of the unit cell in the even number row, and the first output terminal of the unit cell in the odd number row is coupled with the second input terminal of the unit cell in the even number row, and wherein the sub-array further includes a latch circuit row, which is disposed on one end of the sub-array, and includes a latch circuit for latching an output from each unit cell in a N-th row.

17. The integrated circuit according to claim 16 wherein the array further includes a feedback wiring for returning an output from the latch circuit to the first input terminal or the second input terminal of the unit cell in the first row.

18. The integrated circuit according to claim 16 wherein the array is provided by the unit cells, which are arranged in M rows, the integrated circuit further comprising:

a bus for transmitting data;

a first bus interface circuit disposed along with a first side of the array and inputting data supplied from the bus into one of or both of the first input terminal and the second input terminal of the unit cell in the first row of the array; and a second bus interface circuit inputting data supplied from one of or both of the first output terminal and the second output terminal of the unit cell in the M-th row of the array to the bus.

19. The integrated circuit according to claim 16 wherein the array is provided by the unit cells, which are arranged in M rows, the integrated circuit further comprising:

a first data bus, a second data bus and a third data bus, each of which transmits data; and a logical operation circuit for receiving data from the first data bus and the second data bus and for outputting a logical operation result to the third bus, wherein one of or both of the first input terminal and the second input terminal of the unit cell in the first row of the array is coupled with the first data bus or the second data bus, and wherein one of or both of the first output terminal and the second output terminal of the unit cell in the M-th row of the array is coupled with the third data bus.

20. The integrated circuit according to claim 16 further comprising:

a control circuit for reconfiguring the first setting information and the second setting information dynamically.

21. A method of using the an integrated circuit, the integrated circuit comprising:

an array, which is provided by a plurality of unit cells having a predetermined shape and arranged in a matrix manner, wherein each unit cell includes:

a first input terminal, to which a first signal is supplied;

a second input terminal, to which a second signal is supplied;

first and second output terminals, which are disposed to face the first and second input terminals, respectively;

a first logical block for supplying one of a signal relating to a logical operation result of the first signal and the second signal according to first setting information, the first signal or a reverse signal of the first signal, and the second signal or a reverse signal of the second signal to the first output terminal when receiving the first signal and the second signal; and a second logical block for supplying one of a signal relating to a logical operation result of the first signal and the second signal according to second setting information, the first signal or the reverse signal of the first signal, and the second signal or the reverse signal of the second signal to the second output terminal when receiving the first signal and the second signal, the method comprising:

detecting a failure cell by testing an operation of the unit cells; and setting the first setting information and the second setting information in such a manner that the unit cell, which is defined as the failure cell by detection, is bypassed.

* * * * *